(12) United States Patent
Yasukawa

(10) Patent No.: US 7,558,445 B2
(45) Date of Patent: Jul. 7, 2009

(54) ELECTRO-OPTICAL DEVICE AND ELECTRONIC APPARATUS

(75) Inventor: Masahiro Yasukawa, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 12/260,020

(22) Filed: Oct. 28, 2008

(65) Prior Publication Data

US 2009/0121233 A1 May 14, 2009

(30) Foreign Application Priority Data

Nov. 13, 2007 (JP) ............................ 2007-294308

(51) Int. Cl.
*G02F 1/035* (2006.01)
(52) U.S. Cl. ................ 385/2; 385/1; 385/147; 349/139; 349/149
(58) Field of Classification Search ............... 385/1, 385/2, 147; 349/139, 149
See application file for complete search history.

(56) References Cited

U.S. PATENT DOCUMENTS

| 7,362,304 B2* | 4/2008 | Takatori et al. ............ 345/103 |
| 2009/0080154 A1* | 3/2009 | Hirabayashi et al. ........ 361/690 |

FOREIGN PATENT DOCUMENTS

| JP | 8-234239 A | 9/1996 |
| JP | 2000-356787 A | 12/2000 |
| JP | 2001-356709 A | 12/2001 |
| JP | 3307144 B | 7/2002 |
| JP | 2003-307725 A | 10/2003 |
| JP | 2004-004722 A | 1/2004 |
| JP | 2004-170656 A | 6/2004 |
| JP | 2005-045017 A | 2/2005 |
| JP | 3731447 B | 1/2006 |
| JP | 2006-171136 A | 6/2006 |

* cited by examiner

*Primary Examiner*—Jennifer Doan
(74) *Attorney, Agent, or Firm*—AdvantEdge Law Group, LLC

(57) ABSTRACT

An electro-optical device includes a semiconductor layer, a gate electrode, and a first insulating film, and a second insulating under the semiconductor layer. The first insulating film overlaps a junction region, but not a channel region, of the semiconductor layer. The gate electrode includes a first extended portion that continuously covers an upper and side face and of the first insulating film at the junction region. The gate electrode includes a second extended portion that overlaps and fills a groove in the second insulating that extends along at least the junction region.

9 Claims, 12 Drawing Sheets

ELECTRO-OPTICAL DEVICE AND ELECTRONIC APPARATUS

BACKGROUND

1. Technical Field

The present invention relates to a technical field of an electro-optical device, such as a liquid crystal device, and an electronic apparatus, such as a liquid crystal projector, provided with the electro-optical device.

2. Related Art

In an electro-optical device of this type, data lines and scanning lines are wired on a substrate so as to intersect with each other, pixel electrodes are provided in a matrix at positions corresponding to intersections of both the data lines and the scanning lines, and the pixel electrodes are controlled for switching pixel by pixel. Each pixel provides a thin film transistor (TFT) having, for example, a lightly doped drain (LDD) structure as a pixel switching element that controls switching of the pixel electrode.

On the other hand, a liquid crystal device, which is an example of the above electro-optical device, is not only used for a direct-view-type display but also used widely, for example, as a light modulating device (light valve) of a projection-type display device. Particularly, when in a projection-type display device, because intensive light emitted from a light source enters a liquid crystal light valve, a light shielding film, which serves as a light shielding device that blocks incident light, is installed in the liquid crystal light valve so that a TFT in the liquid crystal light valve does not cause an increase in leakage current and/or a malfunction, or the like, because of the intensive light.

In regard to the above light shielding device or the light shielding film, Japanese Patent No. 3731447 and JP-A-2004-4722 describe a technology for shielding a channel region in such a manner that the width of a gate electrode is formed to be wider than the width of a semiconductor layer of a transistor as viewed in plan. In addition, JP-A-2005-45017, Japanese Patent No. 3307144, JP-A-2000-356787, JP-A-2004-170656, and JP-A-2006-171136 describe that contact holes or dummy contact holes that simply shield a semiconductor layer against light are formed on both sides of the semiconductor layer, and light that travels from the sides of the semiconductor layer is blocked by light shielding films deposited in the contact holes or dummy contact holes. The above light shielding films are, for example, integrally formed with the same conductive film of the gate electrode or, according to JP-A-2003-307725, the light shielding film is provided in a layer that is separate from the gate electrode.

Here, when the TFT having an LDD structure is provided as a pixel switching element, in the semiconductor layer of the TFT, particularly, light leakage current tends to easily occur in an LDD region on a side that is electrically connected to the pixel electrode in comparison with an LDD region on a side that is electrically connected to the data line. The above described Japanese Patent No. 3731447, JP-A-2004-4722, JP-A-2005-45017, Japanese Patent No. 3307144, JP-A-2000-356787, JP-A-2004-170656, and JP-A-2006-171136 do not specifically describe light shielding for the above LDD regions and, therefore, there is a possibility that light leakage current may occur in the TFT because of entry of light into the LDD region on a side that is electrically connected to the pixel electrode. Because of the above light leakage current in the TFT, there has been a technical problem in which display defects, such as flicker or pixel chrominance nonuniformity, may occur and, as a result, the quality of a display image decreases. In addition, the light shielding structure of JP-A-2003-307725 has a large area in which a light shielding film is arranged in each pixel and a complex configuration such that various films including the light shielding film are laminated in multiple layers. Thus, there is a technical problem that the manufacturing process thereof may be further complicated.

SUMMARY

An advantage of some aspects of the invention is that it provides an electro-optical device that is able to display a high-quality image while making it possible to effectively reduce the occurrence of light leakage current in a pixel switching TFT with a simple configuration, and an electronic apparatus that is provided with the electro-optical device.

An aspect of the invention provides an electro-optical device. The electro-optical device includes a substrate, a data line, a scanning line, a pixel electrode, a semiconductor layer, a first insulating film, a gate electrode, and a second insulating film. The data line and the scanning line extend on the substrate so as to intersect with each other. The pixel electrode is provided at a position corresponding to an intersection of the data line and the scanning line. The semiconductor layer includes a channel region, a data line side source/drain region, a pixel electrode side source/drain region, a first junction region and a second junction region. The channel region has a channel length in an extending direction in which any one of the data line and the scanning line extends. The data line side source/drain region is electrically connected to the data line. The pixel electrode side source/drain region is electrically connected to the pixel electrode. The first junction region is formed between the channel region and the data line side source/drain region. The second junction region is formed between the channel region and the pixel electrode side source/drain region. The first insulating film is formed in an island shape so as to cover at least the second junction region, out of the first and second junction regions, and so as not to overlap the channel region. The gate electrode includes a body portion, a first extended portion, and a second extended portion. The body portion overlaps the channel region via a gate insulating film. The first extended portion is formed so as to extend from the body portion onto the first insulating film. The second extended portion is formed so as to extend from the first extended portion beside the semiconductor layer in the extending direction. The second insulating film is formed on a lower layer side with respect to the semiconductor layer, and has a groove that is formed so as to at least extend along the second junction region of the semiconductor layer beside the first insulating film as viewed in plan on the substrate. Each first extended portion is formed so as to continuously cover at least portions ranging from an upper face portion located directly above the second junction region to a side face portion located beside the second junction region on a surface of the first insulating film. The second extended portion is arranged so as to overlap the groove, and has an inner groove portion that is formed inside the groove.

According to an electro-optical device of the aspect of the invention, while the electro-optical device is operating, for example, supply of an image signal from the data line to the pixel electrode is controlled while a scanning signal is supplied from the scanning line, so that an image may be displayed by means of so-called active matrix addressing. Note that an image signal is supplied to the pixel electrode from a corresponding one of the data lines through the transistor at a predetermined timing in such a manner that the transistor, which is a switching element electrically connected between the data line and the pixel electrode, is turned on/off in accordance with a scanning signal supplied from a corresponding one of the scanning lines. The pixel electrode is a transparent electrode that is, for example, formed of a transparent conductive material, such as ITO (Indium Tin Oxide). The plurality of pixel electrodes are provided in a matrix in an area, which becomes a display area, on the substrate at positions corresponding to intersections of the data lines and the scanning lines.

The above described transistor is formed of the semiconductor layer that includes the channel region, the data line side source/drain region, the pixel electrode side source/drain region, the first junction region formed between the channel region and the data line side source/drain region, and the second junction region formed between the channel region and the pixel electrode side source/drain region, the gate electrode that overlaps the channel region, and the gate insulating film arranged between the semiconductor layer and the gate electrode. Note that the transistor may be a double-gate thin film transistor in which two gate electrodes hold a semiconductor layer from the upper side and lower side thereof or two gate electrodes are respectively provided for two serially connected channel regions. Furthermore, three or more gate electrodes may be provided.

In the aspect of the invention, the first insulating film is provided on an upper layer side with respect to the semiconductor layer. The first insulating film is provided in an island pattern shape over the second junction region out of the first and second junction regions. The first insulating film is formed over the second junction region so as to cover the surface of at least the second junction region, more specifically, the upper face portion on a side opposite to the side that faces the base of the first insulating film and, in addition, a side face portion.

In addition, the gate electrode is provided so as to face the channel region of the semiconductor layer through the gate insulating film. The gate electrode includes a body portion that overlaps the channel region as viewed in plan, a first extended portion that extends from the body portion onto the first insulating film, and a second extended portion that extends from the first extended portion beside the semiconductor layer along the semiconductor layer.

The first extended portion is formed so as to extend from the body portion that overlaps the channel region onto the first insulating film that at least covers the second junction region. The first extended portion is provided on the surface of the first insulating film so as to cover at least portions ranging from the upper face portion on a side opposite to the side that faces the semiconductor layer to the side face portion beside the semiconductor layer. By so doing, at least the second junction region of the semiconductor layer is covered with the first extended portion continuously from the directly upper portion to the side face portion.

Thus, it is possible for the first extended portion to block at least light that would enter the second junction region, out of the first and second junction regions, from an upper layer side with respect to the second junction region and from a side face thereof. Particularly, as already described above, light leakage current tends to occur in the second junction region of the semiconductor layer. Thus, by blocking light that would enter the second junction region, it is possible to effectively prevent the occurrence of light leakage current.

In addition, the first extended portion is arranged on an upper layer side with respect to the semiconductor layer via the first insulating film or via an insulating film, such as a gate insulating film, in addition to the first insulating film. The first insulating film is preferably formed in thickness that is larger than the gate insulating film. With the above configuration, the body portion of the gate electrode may be arranged locally adjacent to the semiconductor layer in the channel region, while the first extended portion of the gate electrode may be arranged at positions away from the first and second junction regions, respectively, by the amount the first insulating film is present.

If the first extended portion is arranged adjacent to the first and second junction regions, respectively, to about the thickness of the gate insulating film, for example, this electrode portion or the wiring portion undesirably functions as an electrode that applies the same electric potential as a gate voltage to the junction regions to a greater or lesser extent. That is, an unexpected change in carrier density occurs in the junction regions. This leads to the occurrence of leakage current, a variation in on/off threshold, or the like, in the transistor that is originally expected to form a channel by applying the gate voltage to the channel region.

Hence, particularly in the aspect of the invention, because the first insulating film is provided, the first extended portion is arranged adjacent to the first and second regions but not to an extent that the above described leakage current, a variation in on/off threshold, or the like, occurs. Thus, it is possible to effectively prevent the occurrence of malfunction in the transistor.

In addition, the second insulating film is formed on a lower layer side with respect to the semiconductor layer so as to provide interlayer insulation for the semiconductor layer from a lower layer side of the semiconductor layer. In the second insulating film, a groove is formed in the semiconductor layer on each side of the semiconductor layer and on each side of the first insulating film so as to extend along at least the second junction region. The second extended portion of the gate electrode is arranged so as to overlap the groove, which is formed in the second insulating film beside the semiconductor layer, in plan view, and has an inner groove portion that is at least partially formed on the wall and bottom of the groove.

Thus, the inner groove portion is provided at least beside the second junction region of the semiconductor layer as a continuous wall-shaped light shielding body, ranging from an upper layer side to a lower layer side with respect to the second junction region. Thus, it is possible for the inner groove portion to block at least light that would enter the side face of the second junction region of the semiconductor layer from an upper layer side or lower layer side with respect to the second junction region or from the same layer thereof. Thus, because it is also possible for the second extended portion of the gate electrode in addition to the first extended portion to block at least light that would enter the side face of the second junction region of the semiconductor layer, it is possible to enhance light shielding property for the semiconductor layer, particularly, for the second junction region.

According to the light shielding structure of the gate electrode of the aspect of the invention, owing to the above described favorable light shielding ability for the semiconductor layer, it is possible to sufficiently block light without additionally providing a light shielding film, or the like, other than the gate electrode (however, it is more preferable to provide such a light shielding film, or the like). Thus, for example, in comparison with the configuration described in the above JP-A-2003-307725, it is possible to further simplify the configuration of a light shielding structure. As a result, the manufacturing process may be simplified, and an area of arrangement for the non-aperture region (region through which light used for image display does not pass) of each pixel increases, so that it is possible to prevent the aperture region other than the non-aperture region from being further reduced. As a result, even when each pixel is miniaturized, a relatively high aperture ratio may be maintained.

Thus, according to the electro-optical device of the aspect of the invention as described above, it is possible to reduce or prevent the occurrence of display defects, such as flicker, because of the occurrence of light leakage current of the transistor in each pixel while preventing malfunction of the transistor. Thus, according to the electro-optical device of the aspect of the invention, it is possible to achieve a high-quality image display.

In the electro-optical device according to the aspect of the invention, the second extended portion may be arranged on each side of the semiconductor layer with the semiconductor layer placed in between.

According to the above aspect, the groove is formed in the second insulating film on each side of at least the second junction region of the semiconductor layer, the second extended portion of the gate electrode is arranged adjacent to each groove, and the inner groove portion is provided in each groove. Thus, it is possible to further improve light shielding property against light that would enter the side faces of at least the second junction region of the semiconductor layer. Accordingly, it is possible to further effectively reduce light leakage current in the semiconductor layer of the transistor.

In the electro-optical device according to the aspect of the invention, the scanning line and at least the second extended portion of the gate electrode may be formed integrally with the same film.

According to the above aspect, because, in a manufacturing process of the electro-optical device, at least the second extended portion of the gate electrode and the scanning line can be formed in the same process with the same film at the same time, it is possible to further simplify the manufacturing process.

In the electro-optical device according to the aspect of the invention, the electro-optical device may further include a lower light shielding film that is arranged on a lower layer side with respect to the second insulating film on the substrate, that at least partially overlaps the semiconductor layer and that contains a light shielding material, wherein the groove may be formed to extend through the second insulating film to a surface of the lower light shielding film, and wherein the inner groove portion may be formed in the groove so as to be electrically connected to the lower light shielding film.

According to the above aspect, owing to the lower light shielding film, it is possible to shield the transistor against light that would enter the device from a substrate side within returned light, such as light reflected on the rear face of the substrate and/or light that is emitted, in a double-plate projector, from another liquid crystal device and that penetrates through a composite optical system. Thus, it is possible to further reliably reduce the occurrence of light leakage current in the transistor.

In addition, by electrically connecting the lower light shielding film to the inner groove portion, the scanning line is also electrically connected to the lower light shielding film through the second extended portion. It is preferable that the above described lower light shielding film forms a redundant wiring (second scanning line) for the scanning line (first scanning line). With the above configuration, it is possible to further decrease the electrical resistance of the scanning line.

In the electro-optical device according to the aspect of the invention, as viewed in plan on the substrate, the first insulating film may be provided so as not to overlap at least portion of one of the data line side source/drain region or the pixel electrode side source/drain region, wherein the first extended portion may be extended so as to overlap at least portion of one of the data line side source/drain region or the pixel electrode side source/drain region.

According to the above aspect, the first insulating film is provided at portions extending from at least the second junction region, out of the first and second junction regions so as not to overlap at least portion of the pixel electrode side source/drain region corresponding to the second junction region as viewed in plan on the substrate. In addition, the first insulating film is provided so as to extend from the first junction region but not to overlap at least portion of the data line side source/drain region corresponding to the first junction region.

The first extended portion of the gate electrode is formed at portions extending from a portion over the channel region through at least the second junction region, out of the first and second junction regions, to a portion that overlaps at least portion of the pixel electrode side source/drain region corresponding to the second junction region. Thus, the surface of the first insulating film is covered with the first extended portion, ranging from the upper face portion directly above at least the second junction region of the semiconductor layer to the side face portion beside the upper face portion above the semiconductor layer.

Here, in the above aspect, the first extended portion, which is arranged at a position away from at least the second junction region of the semiconductor layer via the first insulating film, is arranged adjacent to at least the pixel electrode side source/drain region to about the thickness of the gate insulating film, for example.

The data line side source/drain region and the pixel electrode side source/drain region are densely doped conductive layers. For this reason, even when the first extended portion of the gate electrode is arranged adjacent to the data line side source/drain region or to the pixel electrode side source/drain region as described above, an electric field generated at the gate electrode substantially or completely does not electrically influence the data line side source/drain region and the pixel electrode side source/drain region to cause a malfunction in the transistor in terms of practical use.

According to the above aspect, it is possible for the first extended portion to cover the side face of at least the second junction region of the semiconductor layer from the side and from at least the side of the corresponding pixel electrode side source/drain region. Thus, it is possible for the first extended portion to block light that would obliquely enter the first and second junction regions from, for example, the side of the data line side source/drain region or pixel electrode side source/drain region. Thus, by enhancing light shielding property for the second junction region of the semiconductor layer, it is possible to further effectively reduce or prevent the occurrence of display defects, such as flicker, due to the occurrence of light leakage current.

In the electro-optical device according to the aspect of the invention, the first insulating film may be formed to have a thickness that is larger than the gate insulating film.

According to the above aspect, by forming the first insulating film to have a thickness larger than the gate insulating film, it is possible to form the body portion of the gate electrode located adjacent to the channel region and form the first extended portion of the gate electrode to be further separated from the first or second junction region with the first insulating film. By so doing, it is possible to reduce the electrical influence from the first extended portion on the first or second junction region to thereby prevent the occurrence of malfunction in the transistor.

In the electro-optical device according to the aspect of the invention, the second junction region, as viewed in plan on the substrate, may be at least partially arranged in a crossover region at which the data line intersects with the scanning line.

According to the above, intersection of the scanning line with the data line improves light shielding ability in the crossover region. Thus, when the second junction region, at which light leakage current tends to occur, is arranged in the crossover region having a high light shielding ability, it is possible to further effectively prevent the occurrence of light leakage current. Hence, it is possible to display a high-quality image.

In the electro-optical device according to the aspect of the invention, the second junction region may be an LDD region.

According to the above aspect, the semiconductor layer has an LDD region (that is, for example, an impurity region that is formed by implanting impurities into the semiconductor layer by means of ion implantation, or the like), and is formed as an LDD thin film transistor. Note that in addition to the second junction region, the first junction region may also be an LDD region.

If light leakage current occurs in an LDD region (hereinafter, referred to as "pixel electrode side LDD region" where appropriate) formed as the second junction region, due to the characteristics of the transistor that has an LDD region, electric current (that is, off electric current) that flows through the data line side source/drain region and the pixel electrode side source/drain region increases while the transistor is turned off.

Particularly, according to the aspect of the invention, it is possible for the gate electrode to effectively block light that would enter the pixel electrode side LDD region. Thus, it is possible to effectively prevent an increase in off electric current as described above and, hence, it is possible to display a high-quality image.

An aspect of the invention provides an electronic apparatus that includes the above described electro-optical device according to the invention.

According to the electronic apparatus of the aspect of the invention, because the electronic apparatus is provided with the above described electro-optical device of the aspect of the invention (including its various aspects), it is possible to implement various electronic apparatuses that are able to perform high-quality display, such as a projection display device, a cellular phone, a personal organizer, a word processor, a viewfinder-type or a direct-view-type video tape recorder, a workstation, a video telephone, a point-of-sales terminal, or a touch panel. In addition, as the electronic apparatus according to the aspect of the invention, it is possible to, for example, implement an electrophoretic device, or the like, such as an electronic paper.

The functions and other advantageous effects of the aspects of invention become apparent from the exemplary embodiments described below.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments according to the invention will be described with reference to the accompanying drawings. In the following embodiments, a TFT active matrix addressing liquid crystal device, which has an installed driving circuit, is used as one example of an electro-optical device according to the aspects of the invention.

First Embodiment

A liquid crystal device according to a first embodiment will be described with reference to FIG. 1 to FIG. 8.

Figure 1:
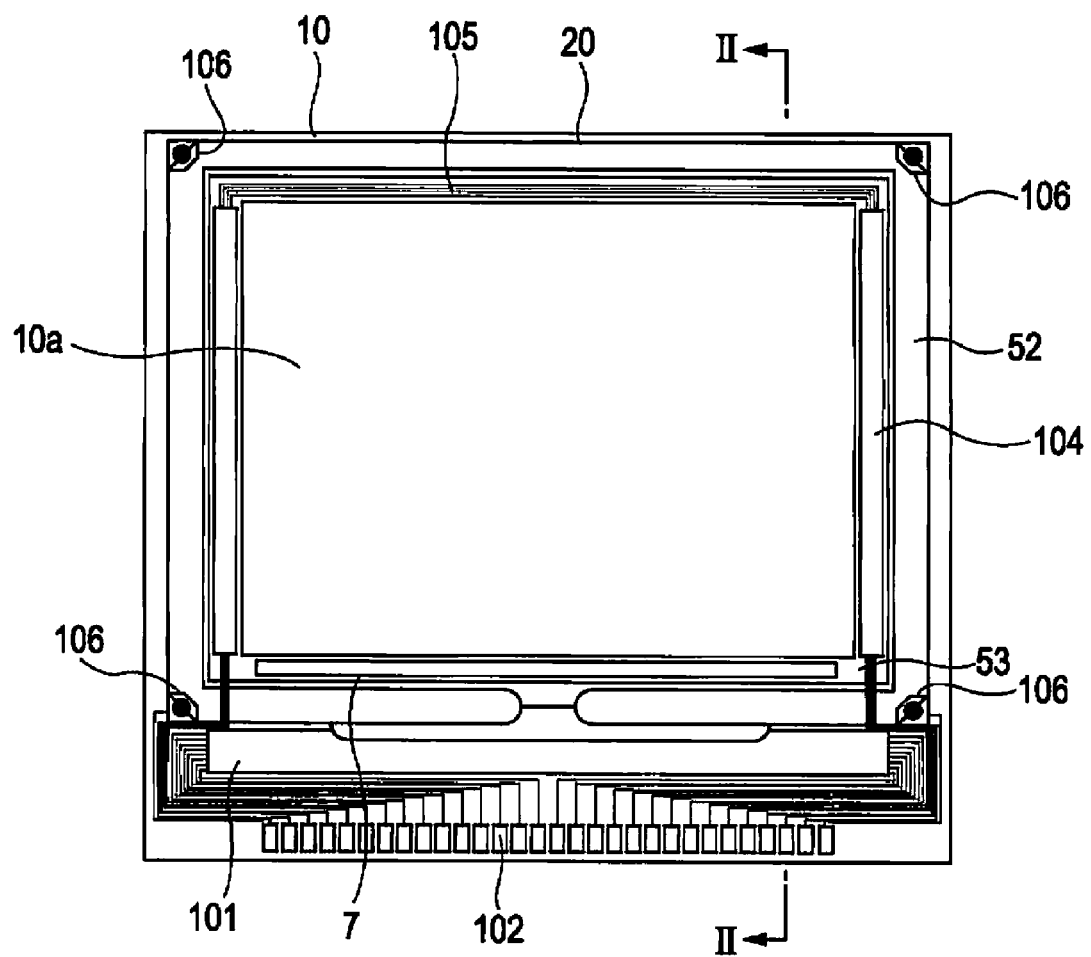
FIG. 1 is a schematic plan view of the configuration of a liquid crystal device according to an embodiment.
Figure 2:
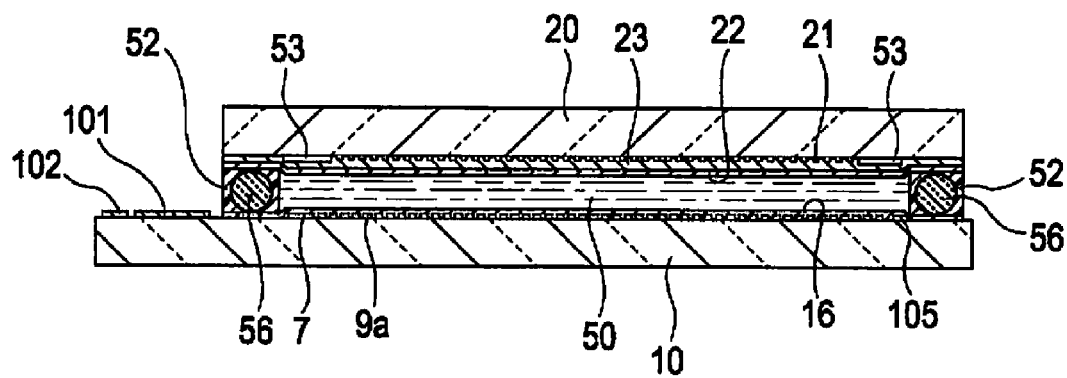
FIG. 2 is a cross-sectional view that is taken along the line II-II in FIG. 1.

The general configuration of the liquid crystal device according to the present embodiment will be described with reference to FIG. 1 and FIG. 2. FIG. 1 is a schematic plan view of the liquid crystal device, showing a TFT array substrate together with various components formed thereon, as viewed from the side of an opposite substrate. FIG. 2 is a cross-sectional view that is taken along the line II-II in FIG. 1.

In FIG. 1 and FIG. 2, the liquid crystal device according to the present embodiment is formed of a TFT array substrate 10 and an opposite substrate 20, which are arranged to face each other. The TFT array substrate 10 is a transparent substrate, such as a quartz substrate, a glass substrate, or a silicon substrate, for example. The opposite substrate 20 is also a transparent substrate that is, for example, formed of the same material as that of the TFT array substrate 10. A liquid crystal layer 50 is sealed between the TFT array substrate 10 and the opposite substrate 20. The TFT array substrate 10 and the opposite substrate 20 are adhered to each other by a seal material 52, which is provided in a seal region located around an image display area 10a.

The seal material 52 is, for example, formed of an ultraviolet curing resin, a thermoset resin, or the like, for adhering both substrates. The seal material 52, after being applied on the TFT array substrate 10 in a manufacturing process, is hardened by ultraviolet irradiation, heating, or the like. In addition, for example, in the seal material 52, gap materials 56, such as glass fibers or glass beads, are dispersed in order to form a gap (inter-substrate gap), having a predetermined value, between the TFT array substrate 10 and the opposite substrate 20. The liquid crystal device according to the present embodiment is suitable for performing enlarged display with a small size used for a light valve of a projector.

In parallel to the inside of the seal region in which the seal material 52 is arranged, a window-frame-shaped light shielding film 53, having a light shielding property, that defines a window frame region of the image display area 10a is provided on the side of the opposite substrate 20. However, part or all of the window-frame-shaped light shielding film 53 may be provided on the side of the TFT array substrate 10 as an internal light shielding film.

In a peripheral region located around the image display area 10a on the TFT array substrate 10, a data line driving circuit 101, a sampling circuit 7, scanning line driving circuits 104, and external circuit connection terminals 102 are formed.

In the peripheral region on the TFT array substrate 10 and on the outer side of the seal region, the data line driving circuit 101 and the external circuit connection terminals 102 are provided along one side of the TFT array substrate 10. In addition, in a region located inside the seal region within the peripheral region on the TFT array substrate 10, the sampling circuit 7 is arranged along one side of the image display area 10a and along one side of the TFT array substrate 10 so as to be covered with the window-frame-shaped light shielding film 53.

The scanning line driving circuits 104 are provided along two sides, adjacent to the one side, of the TFT array substrate 10 so as to be covered with the window-frame-shaped light shielding film 53. Moreover, in order to electrically connect the two scanning line driving circuits 104 provided on both sides of the image display area 10a, a plurality of wirings 105 are provided along the remaining one side of the TFT array substrate 10 so as to be covered with the window-frame-shaped light shielding film 53.

Furthermore, in the peripheral region on the TFT array substrate 10, conductive terminals 106 are arranged at regions that face four corner portions of the opposite substrate 20, and conductive materials are provided between the TFT array substrate 10 and the opposite substrate 20 at positions corresponding to the conductive terminals 106 and electrically connected to the terminals 106.

In FIG. 2, a laminated structure in which pixel switching TFTs, which serve as driving elements, and wirings, such as scanning lines, data lines, and the like, are formed on the TFT array substrate 10. In the image display area 10a, pixel electrodes 9a are provided in a matrix in an upper layer with respect to the pixel switching TFTs and the wirings, such as the scanning lines and the data lines. An alignment layer 16 is formed on the pixel electrodes 9a. Note that, in the present embodiment, the pixel switching elements may be various types of transistors, TFDs (Thin Film Diodes), or the like, other than the TFTs.

On the other hand, a light shielding film 23 is formed on a face of the opposite substrate 20, opposite the TFT array substrate 10. The light shielding film 23 is, for example, formed of a light shielding metal film, or the like, and is patterned, for example, in a grid, or the like, in the image display area 10a on the opposite substrate 20. Then, an opposite electrode 21, which is formed of a transparent material, such as ITO, is formed, for example, in a solid manner on the light shielding film 23 (on the lower side with respect to the light shielding film 23 in FIG. 2) so as to face the plurality of pixel electrodes 9a. Further, an alignment layer 22 is formed on the opposite electrode 21 (on the lower side with respect to the opposite electrode 21 in FIG. 2).

The liquid crystal layer 50 is, for example, formed of liquid crystal that is mixed with a single or multiple types of nematic liquid crystal. The liquid crystal layer 50 is made into a predetermined aligned state between a pair of these alignment layers. Then, when the liquid crystal device is being driven, liquid crystal holding capacitors are formed between the pixel electrodes 9a and the opposite electrode 21 by being applied with voltage, respectively.

Although not shown in the drawing, in addition to the data line driving circuit 101 and the scanning line driving circuits 104, a pre-charge circuit that separately supplies pre-charge signals of predetermined voltage levels to the plurality of data lines in advance of image signals, a check circuit for checking quality, defects, or the like, of the liquid crystal device during manufacturing or upon shipment, or the like, may be formed on the TFT array substrate 10.

Figure 3:
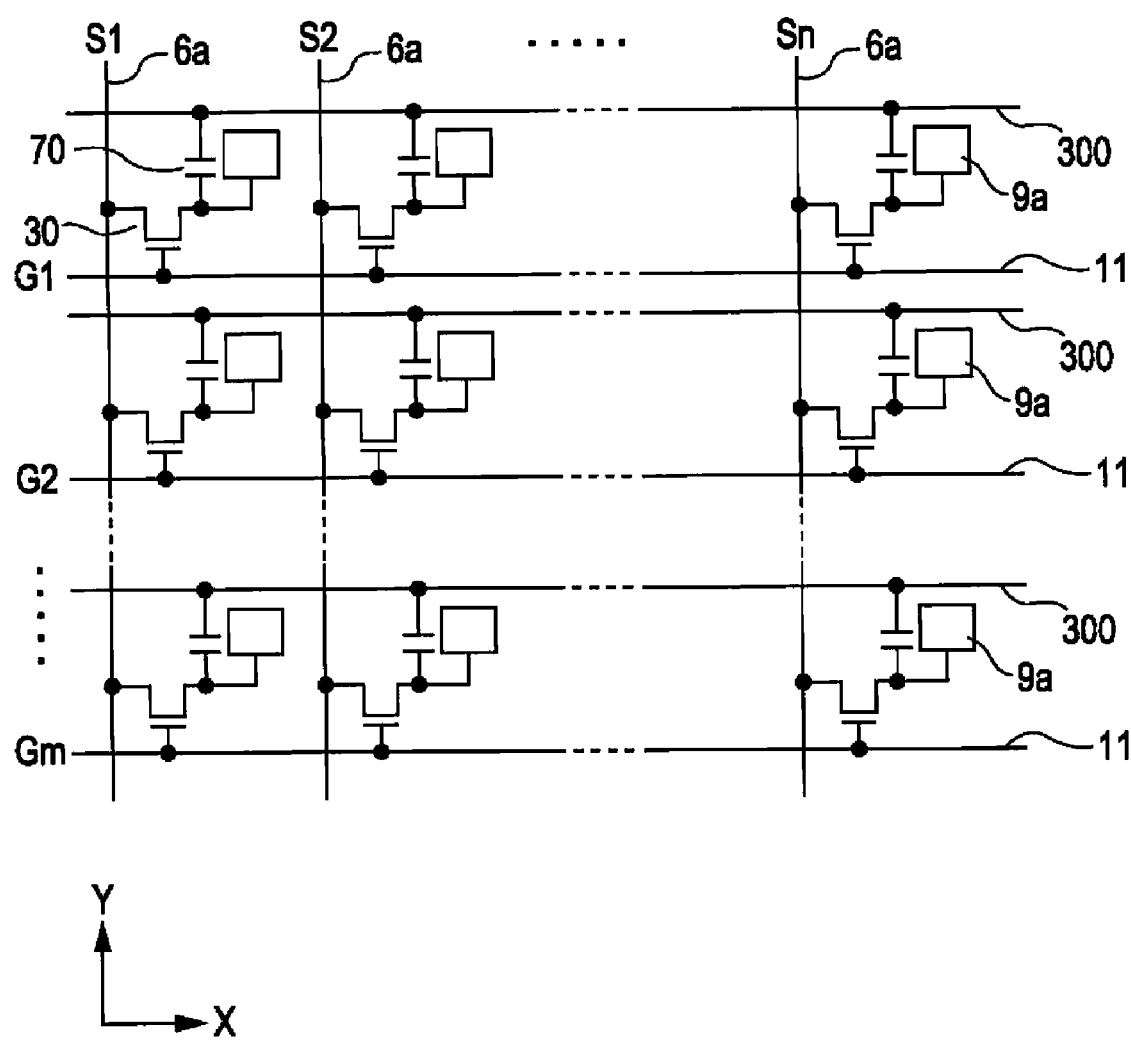
FIG. 3 is an equivalent circuit diagram of a plurality of pixel portions of the liquid crystal device according to a first embodiment.

The electrical configuration of pixel portions of the liquid crystal device according to the present embodiment will be described with reference to FIG. 3. FIG. 3 is an equivalent circuit diagram of various elements, wirings, and the like, in a plurality of pixels that are formed in a matrix and that constitute an image display area of the liquid crystal device according to the present embodiment.

In FIG. 3, the pixel electrode 9a and a TFT 30 are formed in each of a plurality of pixels, which are formed in a matrix and constitute the image display area 10a. Each of the TFTs 30 is electrically connected to a corresponding one of the pixel electrodes 9a, and controls switching of the pixel electrode 9a while the liquid crystal device is operating. Each of the data lines 6a, which are supplied with image signals, is electrically connected to the source of the corresponding TFT 30. The image signals S1, S2, . . . , Sn to be written to the data lines 6a may be supplied in line sequential in this order or may be supplied to the plurality of adjacent data lines 6a group by group.

Each of the scanning lines 11 (preferably, double-layer wiring, which will be described later) is electrically connected to the gate of the corresponding TFT 30. The liquid crystal device according to the present embodiment is configured to apply scanning signals G1, G2, . . . , Gm in line sequential in this order at a predetermined timing to the scanning lines 11 in the form of pulse. Each of the pixel electrodes 9a is electrically connected to the drain of the corresponding TFT 30. By closing the switch of the TFT 30, which serves as a switching element, only during a certain period, the image signals S1, S2, . . . , Sn supplied from the data lines 6a are written to the corresponding pixel electrodes 9a at predetermined timing. The image signals S1, S2, . . . , Sn of predetermined levels, written through the pixel electrodes 9a to liquid crystal, which is one example of an electro-optical material, are held between the pixel electrodes 9a and the opposite electrode 21, which is formed on the opposite substrate 20, during a certain period of time.

Liquid crystal that constitutes the liquid crystal layer 50 (see FIG. 2) modulates light to enable grayshade in such a manner that alignment and/or order of molecular association is varied by an applied voltage level. In the case of a normally white mode, a transmittance ratio to incident light is reduced in accordance with a voltage applied pixel by pixel. In the case of a normally black mode, a transmittance ratio to incident light is increased in accordance with a voltage applied pixel by pixel. As a whole, light having a contrast corresponding to image signals is emitted from the liquid crystal device.

Here, in order to prevent the leakage of image signals being held, storage capacitors 70 are added so as to be electrically in parallel with the liquid crystal capacitors that are formed between the corresponding pixel electrodes 9a and the opposite electrode 21 (see FIG. 2). Each of the storage capacitors 70 is a capacitive element that functions as a holding capacitor that temporarily holds an electric potential of the corresponding pixel electrode 9a in accordance with supply of an image signal. One of electrodes of the storage capacitor 70 is electrically in parallel with the pixel electrode 9a and is connected to the drain of the TFT 30, and the other electrode is connected to a capacitor line 300 having a fixed electric potential so as to be applied with a constant electric potential. Owing to the storage capacitor 70, electric potential holding characteristic is improved in the pixel electrode 9a, and it is possible to improve contrast and to improve display characteristics, such as a reduction in flicker. Note that the storage capacitor 70, as will be described later, also functions as an internal light shielding film that blocks light that would enter the TFT 30.

Figure 4:
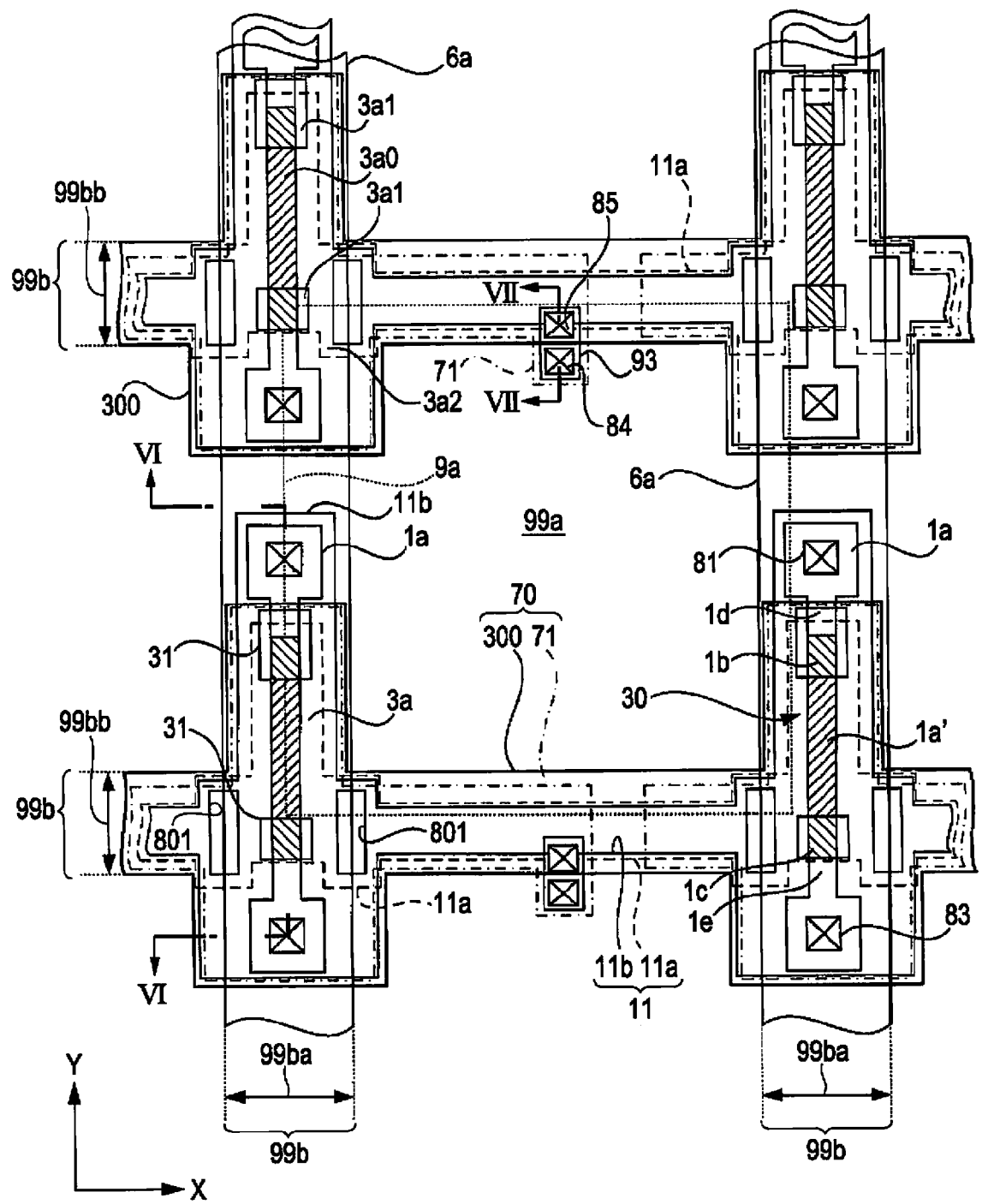
FIG. 4 is a plan view of a plurality of adjacent pixel portions.
Figure 5:
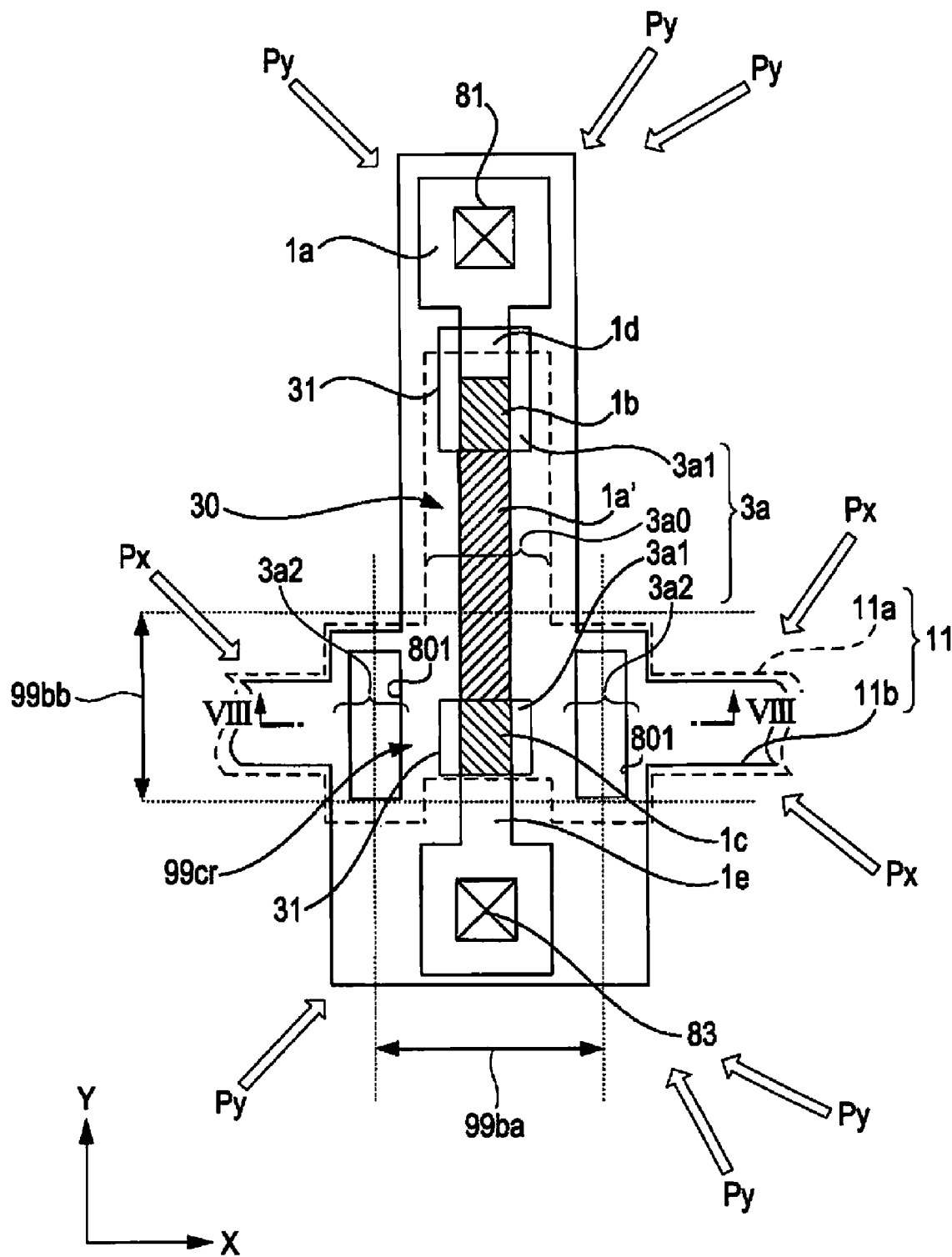
FIG. 5 is a plan view that focuses on a transistor and that shows the configuration of the transistor.
Figure 6:
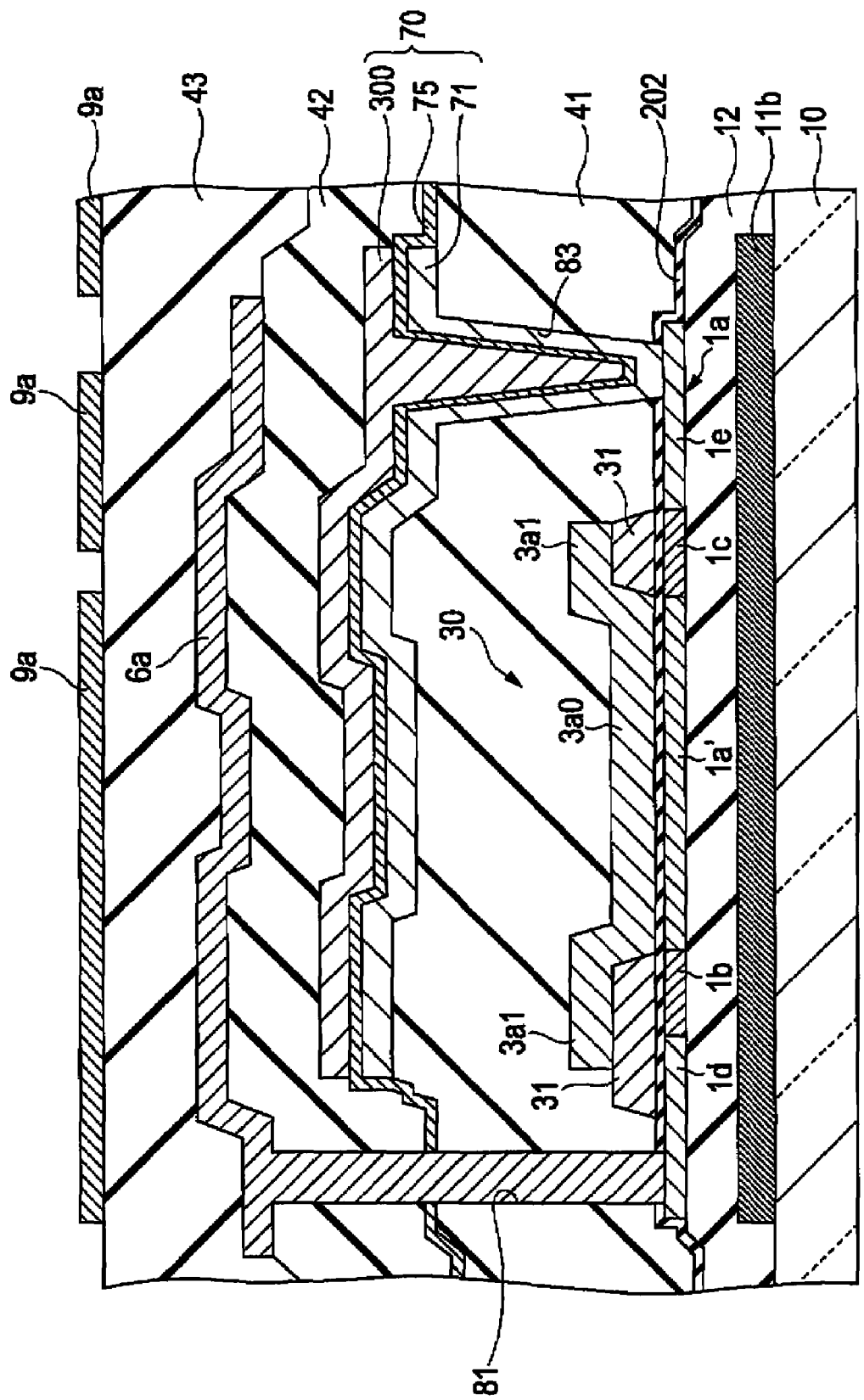
FIG. 6 is a cross-sectional view that is taken along the line VI-VI in FIG. 4.
Figure 7:
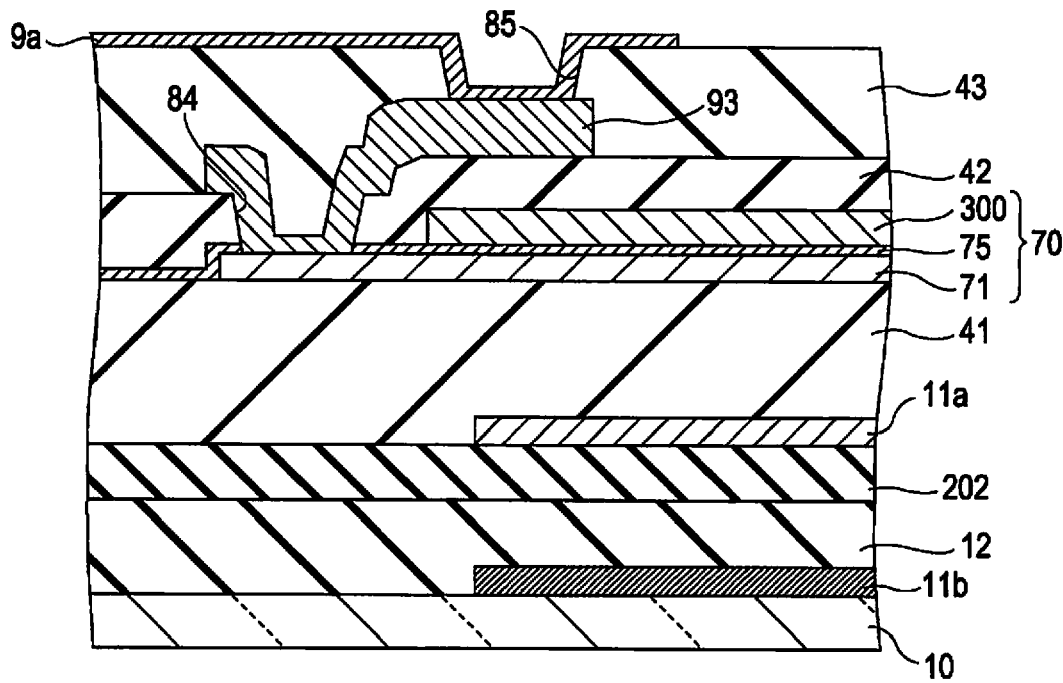
FIG. 7 is a cross-sectional view that is taken along the line VII-VII in FIG. 4.
Figure 8:
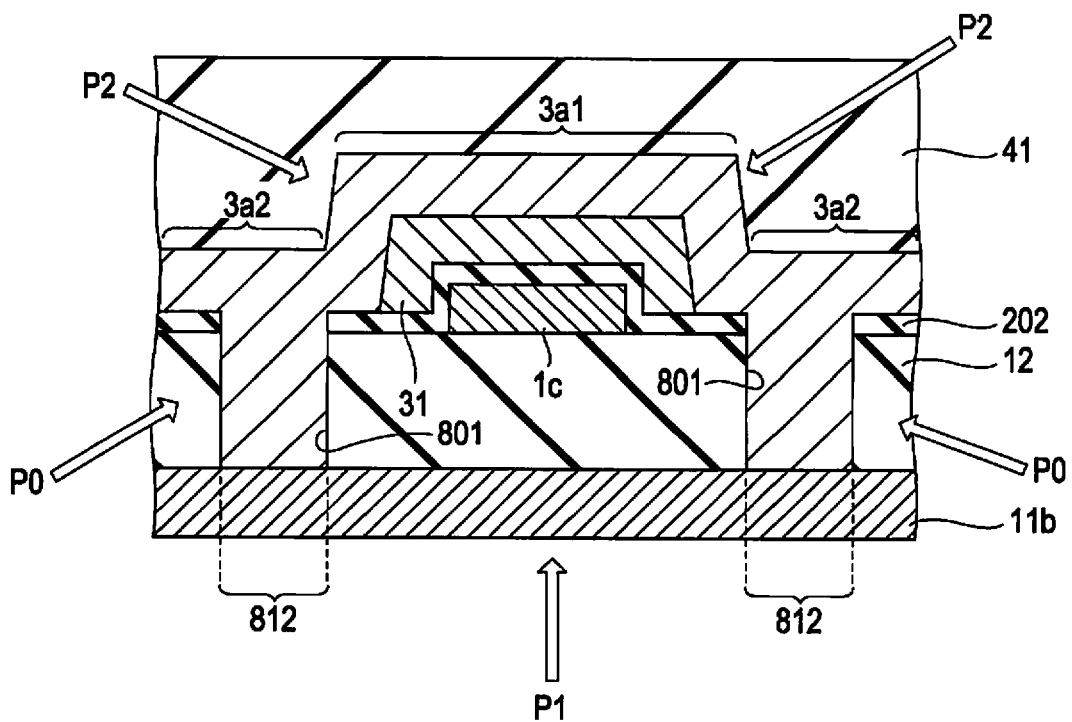
FIG. 8 is an enlarged cross-sectional view that is taken along the line VIII-VIII in FIG. 5.

Next, the specific configuration of the pixel portions that implement the above operation will be described with reference to FIG. 4 to FIG. 8 in addition to FIG. 1 to FIG. 3. FIG. 4 is a plan view of the plurality of mutually adjacent pixel portions. FIG. 5 is a plan view that focuses on the transistor and that shows the configuration of the transistor. FIG. 6 is a cross-sectional view that is taken along the line VI-VI in FIG. 4. FIG. 7 is a cross-sectional view that is taken along the line VII-VII in FIG. 4. FIG. 8 is an enlarged cross-sectional view that is taken along the line VIII-VIII in FIG. 5.

Note that, in FIG. 4 to FIG. 8, in order to make it easier to recognize the layers and components in the drawings, the scales of the components are appropriately varied. This also applies to the relevant drawings, which will be described later. In FIG. 4 to FIG. 8, only the configuration of the TFT array substrate side will be described among the configurations described with reference to FIG. 1 or FIG. 2; however, for easier description, portions located on or above the pixel electrodes 9a are not shown in these drawings.

In FIG. 4, the plurality of pixel electrodes 9a are provided on the TFT array substrate 10 in a matrix. The data lines 6a and the scanning lines 11 are provided along vertical and horizontal boundaries between the adjacent pixel electrodes 9a. The scanning lines 11 extend in the X direction, and the data lines 6a extend in the Y direction so as to intersect with the scanning lines 11. Note that in FIG. 4, the configuration of the pixel electrode 9a is schematically shown in a selected pixel.

Each scanning line 11 includes a first scanning line 11a that is formed integrally with the gate electrodes 3a and a second scanning line 11b that also serves as a lower side light shielding film. The first scanning line 11a and the second scanning line 11b are wired in a double layer along the X direction. The pixel switching TFT 30 is provided at each of the positions corresponding to the intersections of the scanning lines 11 and the data lines 6a. In this manner, because the first and second scanning lines 11a and 11b are wired in a double layer, it is possible to decrease the electrical resistance of each scanning line 11 overall. In addition, even when inconvenience, such as a break in one of the first and second scanning lines 11a and 11b, occurs, the other line may be used redundantly. Thus, it is possible to improve reliability of the liquid crystal device.

The scanning lines 11a, the data lines 6a, the storage capacitors 70, the TFTs 30, and relay layers 93 are arranged in a non-aperture region 99b on the TFT array substrate 10, which surrounds aperture regions 99a of the pixels (that is, regions of the pixels, in which light is transmitted or reflected to contribute to actual display) corresponding to the pixel electrodes 9a, as viewed in plan. That is, these scanning lines 11a, data lines 6a, storage capacitors 70, TFTs 30, and relay layers 93 are arranged not in the aperture regions 99a of the pixels but in the non-aperture region 99b so as not to hinder display.

The non-aperture region 99b is formed on the side of the TFT array substrate 10 as a region that is able to block light that would enter the pixels by light shielding films, which are, for example, formed of a light shielding material that at least partially constitutes the data lines 6a, the scanning lines 11 or the storage capacitors 70, formed on the side of the TFT array substrate 10. More specifically, the non-aperture region 99b includes a first region 99ba extending in the Y direction and a second region 99bb extending in the X direction. In addition, preferably, as described with reference to FIG. 2, the non-aperture region 99b is defined by the light shielding films 23 formed on the side of the opposite substrate 20 in cooperation with the light shielding films on the side of the TFT array substrate 10.

Hereinafter, the components of the pixel portion shown in FIG. 6 to FIG. 8 will be described sequentially from the lower layer side.

In FIG. 6, the second scanning lines 11b are arranged on the TFT array substrate 10 and are, for example, formed of light shielding conductive material, such as a high-melting point metal material that includes tungsten (W), titanium (Ti), titanium nitride (TiN), and the like. In addition, the second scanning lines 11b are formed in a stripe in the image display area 10a in the X direction together with the corresponding first scanning lines 11a as shown in FIG. 4 or FIG. 5, as described above. As shown in FIG. 4 or FIG. 5, each of the second scanning lines 11b is preferably formed to include regions that face the channel region 1a', the data line side LDD region 1b, the pixel electrode side LDD region 1c, the data line side source/drain region 1d and the pixel electrode side source/drain region 1e, of the TFT 30. Thus, owing to the second scanning lines 11b, it is possible to block light that travels toward the TFTs 30 within returned light, such as light reflected on the rear face of the TFT array substrate 10 and/or light that is emitted, in a double-plate projector, from another liquid crystal device and that penetrates through a composite optical system.

As shown in FIG. 6 or FIG. 7, the base insulating film 12, which is an example of a "second insulating film" according to the aspects of the invention, is, for example, formed of silicon oxide film. The base insulating film 12 has a function to prevent the surface of the TFT array substrate 10 from being rough while the surface is being polished and a function to prevent the characteristics of the pixel switching TFT 30 from being changed because of dirt that is left after washing, or the like, by forming the base insulating film 12 all over the TFT array substrate 10.

In FIG. 4 to FIG. 6, each of the TFTs 30 is formed to include a semiconductor layer 1a and a gate electrode 3a.

Each of the semiconductor layers 1a is, for example, formed of polysilicon and includes a channel region 1a' having a channel length in the Y direction in FIG. 4 or FIG. 5, a data line side LDD region 1b, a pixel electrode side LDD region 1c, a data line side source/drain region 1d and a pixel electrode side source/drain region 1e. That is, each of the TFTs 30 has an LDD structure. Note that the data line side LDD region 1b is an example of a "first junction region" according to the aspects of the invention, and the pixel electrode side LDD region 1c is an example of a "second junction region" according to the aspects of the invention.

As shown in FIG. 4 or FIG. 5, the data line side source/drain region 1d and the pixel electrode side source/drain region 1e are formed in substantially mirror symmetry in the Y direction with respect to the channel region 1a'. That is, the data line side LDD region 1b is formed between the channel region 1a' and the data line side source/drain region 1d. The pixel electrode side LDD region 1c is formed between the channel region 1a' and the pixel electrode side source/drain region 1e. The data line side LDD region 1b, the pixel electrode side LDD region 1c, the data line side source/drain region 1d and the pixel electrode side source/drain region 1e are impurity regions that are formed by implanting impurities into the semiconductor layer 1a by means of impurity implantation, such as ion implantation, for example. The data line side LDD region 1b and the pixel electrode side LDD region 1c are formed as lightly-doped impurity regions that respectively have smaller impurities than the data line side source/drain region 1d and the pixel electrode side source/drain region 1e. According to the above impurity regions, while the TFT 30 is not operating, it is possible to reduce an off current that flows through the source region and the drain region and also possible to suppress a decrease in on current that flows while the TFT 30 is operating. Note that the TFT 30 preferably has an LDD structure; however, the TFT 30 may have an offset structure in which impurities are not implanted in the data line side LDD region 1b and the pixel electrode side LDD region 1c, or may have a self-aligned structure in which the data line side source/drain region and the pixel electrode side source/drain region are formed by implanting impurities densely using the gate electrode as a mask.

In the present embodiment, as best shown in FIG. 4 to FIG. 6, a first insulating film 31 is at least provided over the pixel electrode side LDD region 1c, out of two LDD regions 1b and 1c, of each semiconductor layer 1a. As shown in FIG. 6 or FIG. 8, the first insulating film 31 is formed in an upper layer side over the surface of the pixel electrode side LDD region 1c, more specifically, so as to cover the upper face portion of the pixel electrode side LDD region 1c, opposite to the side facing the base insulating film 12 and is also continuously formed with the upper face portion to cover at least side face portions of the pixel electrode side LDD region 1c on both sides of the semiconductor layer 1a. In addition, the first insulating film 31 is formed in an island shape so as not to overlap the channel region 1a' of the semiconductor layer 1a as viewed in plan. Preferably, the first insulating film 31 is also provided for the data line side LDD region 1b as in the case of the pixel electrode side LDD region 1c side. The first insulating film 31 is, for example, formed of silicon dioxide (SiO$_2$).

As shown in FIG. 6 or FIG. 8, the first scanning lines 11a are arranged on the upper layer side above the semiconductor layer 1a via an insulating film 202, which is, for example, formed of silicon oxide film, or the like. The first scanning lines 11a are, for example, made of conductive polysilicon and are formed so as to extend in the X direction together with the second scanning lines 11b, as shown in FIG. 4 or FIG. 5.

The gate electrodes 3a, which have a light shielding property, are preferably formed as portions of the first scanning lines 11a.

Each gate electrode 3a should have the original gate function and may be desirably formed of a single layer or multiple layers of a light shielding and opaque polysilicon film, metal film, metal silicide film, or the like, having, for example, a high reflectance or a high optical absorptance. However, when the material of each gate electrode 3a has some light shielding ability (that is, light reflecting ability or light absorbing ability), the gate electrode 3a provides the function of blocking light that would enter the data line side LDD region 1b or the pixel electrode side LDD region 1c as far as it has the specific shape and arrangement, which will be described later.

As shown in FIG. 4 to FIG. 6, each of the gate electrodes 3a includes a gate electrode body portion 3a0 that overlaps the channel region 1a', a first extended portion 3a1 that extends from the gate electrode body portion 3a0 onto the first insulating film 31, and a second extended portion 3a2 that extends from the first extended portion 3a1 to both sides of the semiconductor layer 1a in the Y direction. Note that preferably, the gate electrode 3a is not limited to the configuration such that the gate electrode 3a is formed integrally with the first scanning line 11a as shown in FIG. 4 or FIG. 5. Instead, it is applicable that at least the second extended portion 3a2 of the gate electrode 3a is formed integrally with the first scanning line 11a. According to the above configuration, because, in a manufacturing process of the liquid crystal device, at least the second extended portions 3a2 of the gate electrode 3a and the first scanning line 11a can be formed in the same process with the same film at the same time, it is possible to further simplify the manufacturing process. Furthermore, the gate electrode 3a by itself may be formed of a conductive film that is formed separately from the first scanning line 11a.

As shown in FIG. 5 and FIG. 6, the first extended portions 3a1 are formed on the first insulating film 31 so as to overlap the pixel electrode side LDD region 1c and the data line side LDD region 1b. Specifically, as shown in FIG. 6, the first extended portions 3a1 are arranged over the pixel electrode side LDD region 1c and the data line side LDD region 1b, respectively, via the first insulating film 31 and the insulating film 202.

As shown in FIG. 5 and FIG. 8, particularly in the present embodiment, the first extended portions 3a1 are provided so as to cover, on the surface of the first insulating film 31, at least portions extending from the upper face portion of the first insulating film 31, opposite to the side facing the semiconductor layer 1a to the side face portions thereof on both sides of the semiconductor layer 1a. In this manner, as shown in FIG. 8, at least the pixel electrode side LDD region 1c of the semiconductor layer 1a is covered at portions ranging from its directly upper side to the side faces with the first extended portions 3a1 continuously. Thus, it is possible for the first extended portions 3a1 to block light that would enter at least the pixel electrode side LDD region 1c of the semiconductor layer 1a from the upper layer side or side faces thereof, for example, in the directions indicated by arrows P2 shown in FIG. 8. Note that as shown in FIG. 5 and FIG. 6, the first extended portion 3a1 is also formed to extend over the data line side LDD region 1b of the semiconductor layer 1a on the first insulating film 31, as in the case of the pixel electrode side LDD region 1c, so that it is also possible for the first extended portion 3a1 to shield the data line side LDD region 1b against light.

In addition, as shown in FIG. 6, the first extended portions 3a1 are arranged via the first insulating film 31 and the insulating film 202. Here, the first insulating film 31 is preferably formed in thickness that is at least larger than a portion of the insulating film 202 which constitutes a gate insulating film. With the above configuration, the gate electrode body portion $3a0$ may be arranged locally adjacent to the semiconductor layer $1a$ in the channel region $1a'$, while the first extended portions $3a1$ may be arranged at positions away from the pixel electrode side LDD region $1c$ and the data line side LDD region $1b$, respectively, by the amount the first insulating film 31 is present.

If the first extended portions $3a1$ are arranged adjacent to the pixel electrode side LDD region $1c$ and the data line side LDD region $1b$, respectively, to about the thickness of the gate insulating film, for example, this electrode portion undesirably functions as an electrode that applies the same electric potential as a gate voltage to the LDD region $1b$ or $1c$ to a greater or lesser extent. That is, an unexpected change in carrier density occurs in the pixel electrode side LDD region $1c$ and in the data line side LDD region $1b$. This leads to the occurrence of leakage current, a variation in on/off threshold, or the like, in the TFT 30 that is originally expected to form a channel by applying the gate voltage to the channel region $1a'$.

Hence, particularly in the present embodiment, because the first insulating film 31 is provided, the first extended portions $3a1$ are arranged adjacent to the pixel electrode side LDD region $1c$ and the data line side LDD region $1b$ but not to an extent that the above described leakage current, a variation in on/off threshold, or the like, occurs. Thus, it is possible to effectively prevent the occurrence of malfunction in the TFT 30.

As shown in FIG. 4 or FIG. 5, in the base insulating film 12, grooves 801 are formed on both sides of the semiconductor layer $1a$ and on both sides of the first insulating film 31. As shown in FIG. 5 or FIG. 8, the second extended portions $3a2$ of the gate electrode $3a$ are arranged so as to overlap the grooves 801 in plan view, and have inner groove portions 812 (see FIG. 8) that are at least partially formed on the walls and bottoms of the grooves 801. In the present embodiment, as shown in FIG. 8, each groove 801 is formed to extend through the base insulating film 12, as a contact hole that, for example, electrically connects the second extended portion $3a2$ with the second scanning line $11b$. Inside each groove 801, the inner groove portion 812 of the second extended portion $3a2$ is electrically connected to the second scanning line $11b$. Thus, the first and second scanning lines $11a$ and $11b$ are electrically connected through the second extended portions $3a2$ of the gate electrode $3a$.

The grooves 801 are formed in the base insulating film 12 so as to extend preferably on both sides of the semiconductor layer $1a$ at least along the pixel electrode side LDD region $1c$. Thus, as shown in FIG. 8, the inner groove portions 812 of the second extended portions $3a2$ are provided on both sides of the pixel electrode side LDD region $1c$ as a continuous wall-shaped light shielding body from an upper layer side to a lower layer side with respect to the pixel electrode side LDD region $1c$. Thus, on both sides of the semiconductor layer $1a$, it is possible for the inner groove portions 812 to block at least light that would travel, for example, in the directions indicated by arrows P0 and P2 in FIG. 8 and then enter the side faces of the pixel electrode side LDD region $1c$ from an upper layer side or lower layer side with respect to the pixel electrode side LDD region $1c$ or from the same layer thereof. Note that light that would travel, for example, in the direction indicated by arrow P1 in FIG. 8 and then enter the pixel electrode side LDD region $1c$ from a lower layer side thereof may be blocked by the second scanning line $11b$ that is arranged so as to cover the pixel electrode side LDD region $1c$.

Thus, according to the configuration of the gate electrode $3a$ as described above, it is possible for the first extended portions $3a1$ and the second extended portions $3a2$ to improve light shielding property against light that would enter at least the pixel electrode side LDD region $1c$ of the semiconductor layer $1a$. As already described above, light leakage current particularly tends to occur in the pixel electrode side LDD region $1c$ of the semiconductor layer $1a$ as well as the channel region $1a'$. Thus, by blocking light that would enter the pixel electrode side LDD region $1c$, it is possible to effectively prevent the occurrence of light leakage current.

Note that as shown in FIG. 5 and FIG. 6, the channel region $1a'$ of the semiconductor layer $1a$ is covered with the body portion $3a0$ of the gate electrode $3a$ from the directly upper side to the side faces, and the second scanning line $11b$ is arranged on the lower layer side with respect to the channel region $1a'$ so as to overlap the channel region $1a'$ as described above. Thus, as in the case of the pixel electrode side LDD region $1c$, it is possible to ensure light shielding property for the channel region $1a'$ and prevent the occurrence of light leakage current.

According to the light shielding structure of the gate electrode $3a$ of the present embodiment, owing to the above described favorable light shielding ability for the semiconductor layer $1a$, it is possible to sufficiently block light without additionally providing a light shielding film, or the like, other than the gate electrode $3a$ (however, it is more preferable to provide such a light shielding film, or the like). Thus, for example, in comparison with the configuration described in the above JP-A-2003-307725, it is possible to further simplify the configuration of a light shielding structure. As a result, the manufacturing process may be simplified, and an area of arrangement for the non-aperture region $99b$ of each pixel increases, so that it is possible to prevent the aperture region other than the non-aperture region $99b$ from being further reduced. As a result, even when each pixel is miniaturized, a relatively high aperture ratio may be maintained.

In addition, as shown in FIG. 4 or FIG. 5, the pixel electrode side LDD region $1c$ of the semiconductor layer $1a$ is arranged in the non-aperture region $99b$ at a crossover region $99cr$ at which the first region $99ba$ and the second region $99bb$ intersects with each other. In the crossover region $99cr$, among rays of light that would enter the pixel electrode side LDD region $1c$ from an upper layer thereof, light that travels in the traveling directions indicated by arrows Py in FIG. 5 may be blocked by the first region $99ba$, and light that travels in the traveling directions indicated by arrows Px in FIG. 5 may be blocked by the second region $99bb$. Note that, in FIG. 5, the arrows Py indicate examples of traveling directions of light having a component that travels in the Y direction, and the arrows Px indicate examples of traveling directions of light having a component that travels in the X direction.

Thus, in the crossover region $99cr$, in addition to the gate electrode $3a$, it is possible to block light that travels toward the pixel electrode side LDD region $1c$ by the first region $99ba$ and the second region $99bb$. Hence, it is possible to effectively reduce light that enters the pixel electrode side LDD region $1c$.

In addition, in the present embodiment, even when no additional light shielding region, other than the crossover region $99cr$, is provided for the pixel electrode side LDD region $1c$, it is possible to enhance a light shielding property pinpoint to the pixel electrode side LDD region $1c$. Thus, by providing a region for pinpoint enhancement of a light shielding property, an area of arrangement for the non-aperture region 99b increases and, hence, it is possible to prevent the aperture regions 99a from being reduced.

In FIG. 6, the storage capacitor 70 is provided on an upper layer side with respect to the TFT 30 via an interlayer insulating film 41 on the TFT array substrate 10.

The storage capacitor 70 is formed so that a lower capacitor electrode 71 and an upper capacitor electrode 300 are arranged so as to face each other across a dielectric film 75.

As shown in FIG. 4, the upper capacitor electrode is formed as portion of the capacitor line 300. Although the configuration of the capacitor line 300 is not shown in the drawing, the capacitor line 300 extends from the image display area 10a, in which the pixel electrodes 9a are arranged, to the periphery of the image display area 10a, and is electrically connected to a constant electric potential source. In this manner, the upper capacitor electrode 300 is maintained at a fixed electric potential and functions as a fixed electric potential side capacitor electrode. The upper capacitor electrode 300 is, for example, formed of an opaque metal film that contains metal, such as Al (aluminum), Ag (silver), for example, or alloy of them, and functions as an upper side light shielding film (internal light shielding film) that shields the TFT 30. Note that, the upper capacitor electrode 300 may be, for example, formed of metal simple substance, alloy, metal silicide, or polysilicide, which contains at least one of high-melting point metals, such as Ti (titanium), Cr (chromium), W (tungsten), Ta (tantalum), Mo (molybdenum), Pd (palladium), or a laminated structure of them.

As shown in FIG. 4, FIG. 6, or FIG. 7, the lower capacitor electrode 71 is a pixel electric potential side capacitor electrode that is electrically connected to both the pixel electrode side source/drain region 1e of the TFT 30 and the pixel electrode 9a. More specifically, the lower capacitor electrode 71 is electrically connected through a contact hole 83 (see FIG. 4 and FIG. 6) to the pixel electrode side source/drain region 1e and also electrically connected through a contact hole 84 (see FIG. 4 and FIG. 7) to a relay layer 93. Furthermore, the relay layer 93 is electrically connected through a contact hole 85 (see FIG. 4 and FIG. 7) to the pixel electrode 9a. That is, the lower capacitor electrode 71, in cooperation with the relay layer 93, relays electrical connection between the pixel electrode side source/drain region 1e and the pixel electrode 9a. The lower capacitor electrode 71 is, for example, formed of conductive polysilicon or opaque metal film that contains, for example, metal, such as Al (aluminum), or alloy.

Here, the lower capacitor electrode 71 preferably not only functions as the pixel electric potential side capacitor electrode but also functions as a light absorption layer or a light shielding film arranged between the TFT 30 and the upper capacitor electrode 300, which serves as the upper side light shielding film. Thus, in the crossover region 99cr, light that would enter the pixel electrode side LDD region 1c from an upper layer thereof may be blocked by the upper capacitor electrode 300 and the lower capacitor electrode 71 as well.

The dielectric film 75 has a monolayer structure or a multilayer structure, which is, for example, formed of silicon oxide film, such as HTO (High Temperature Oxide) film or LTO (Low Temperature Oxide) film, silicon nitride film, or the like.

In FIG. 6 and FIG. 7, the data line 6a and the relay layer 93 are provided on an upper layer side with respect to the storage capacitor 70 through the interlayer insulating film 42 on the TFT array substrate 10.

The data line 6a is electrically connected to the data line side source/drain region 1d of the semiconductor layer 1a through a contact hole 81 that extends through the insulating film 202, the interlayer insulating film 41, the dielectric film 75 and the interlayer insulating film 42.

The data line 6a and the inside of the contact hole 81 are, for example, formed of a material that contains Al (aluminum), such as Al—Si—Cu or Al—Cu, Al element substance, or a multilayer film formed of Al layer and TiN layer. The data line 6a also has a function to shield the TFT 30 against light.

As shown in FIG. 4, the data line 6a is formed in the crossover region 99cr (see FIG. 5) so as to overlap the gate electrode 3a. Thus, in the crossover region 99cr, light that would enter the pixel electrode side LDD region 1c from an upper layer side thereof may be blocked by the data line 6a as well.

In FIG. 4 and FIG. 7, the relay layer 93 is formed in the same layer as the data line 6a (see FIG. 6) on the interlayer insulating film 42. The data line 6a and the relay layer 93 are, for example, formed in such a manner that a thin film formed of a conductive material, such as a metal film, is formed on the interlayer insulating film 42 using thin film formation method, and the thin film is partly removed, that is, patterned. Thus, the data line 6a and the relay layer 93 are formed so as to be spaced apart from each other. Thus, because the data line 6a and the relay layer 93 may be formed in the same process, it is possible to simplify a manufacturing process of the device.

In FIG. 6 and FIG. 7, the pixel electrode 9a is formed on an upper layer side with respect to the data line 6a through the interlayer insulating film 43. The pixel electrode 9a is electrically connected through the lower capacitor electrode 71, the contact holes 83, 84 and 85, and the relay layer 93 to the pixel electrode side source/drain region 1e of the semiconductor layer 1a. The contact hole 85 is formed so that a conductive material, such as ITO, that constitutes the pixel electrode 9a is deposited on the inner wall of a hole portion that is formed to extend through the interlayer insulating film 43. An alignment layer 16 (see FIG. 2), on which a predetermined alignment process such as rubbing process has been performed, is provided on the upper surface of the pixel electrode 9a.

The configuration of the pixel portion as described above is common to all the pixel portions. The above configured pixel portion is regularly formed in the image display area 10a (see FIG. 1).

Thus, according to the liquid crystal device of the present embodiment as described above, it is possible to reduce or prevent the occurrence of display defects, such as flicker, because of the occurrence of light leakage current in the TFT 30 while preventing malfunction of the TFT 30. Hence, a high-quality image display may be achieved in the liquid crystal device.

Figure 9:
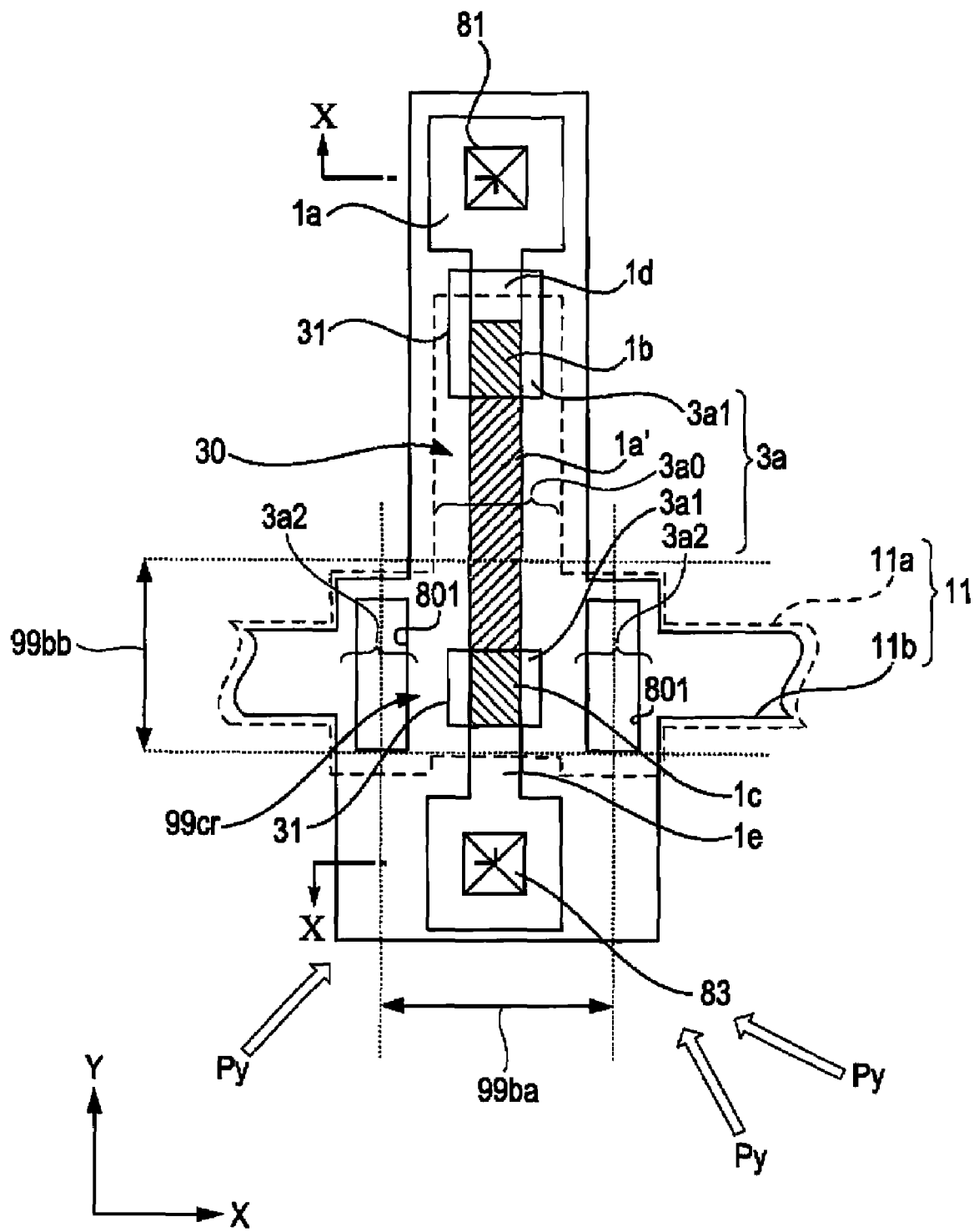
FIG. 9 is a plan view, similar to FIG. 5, according to an alternative example.
Figure 10:
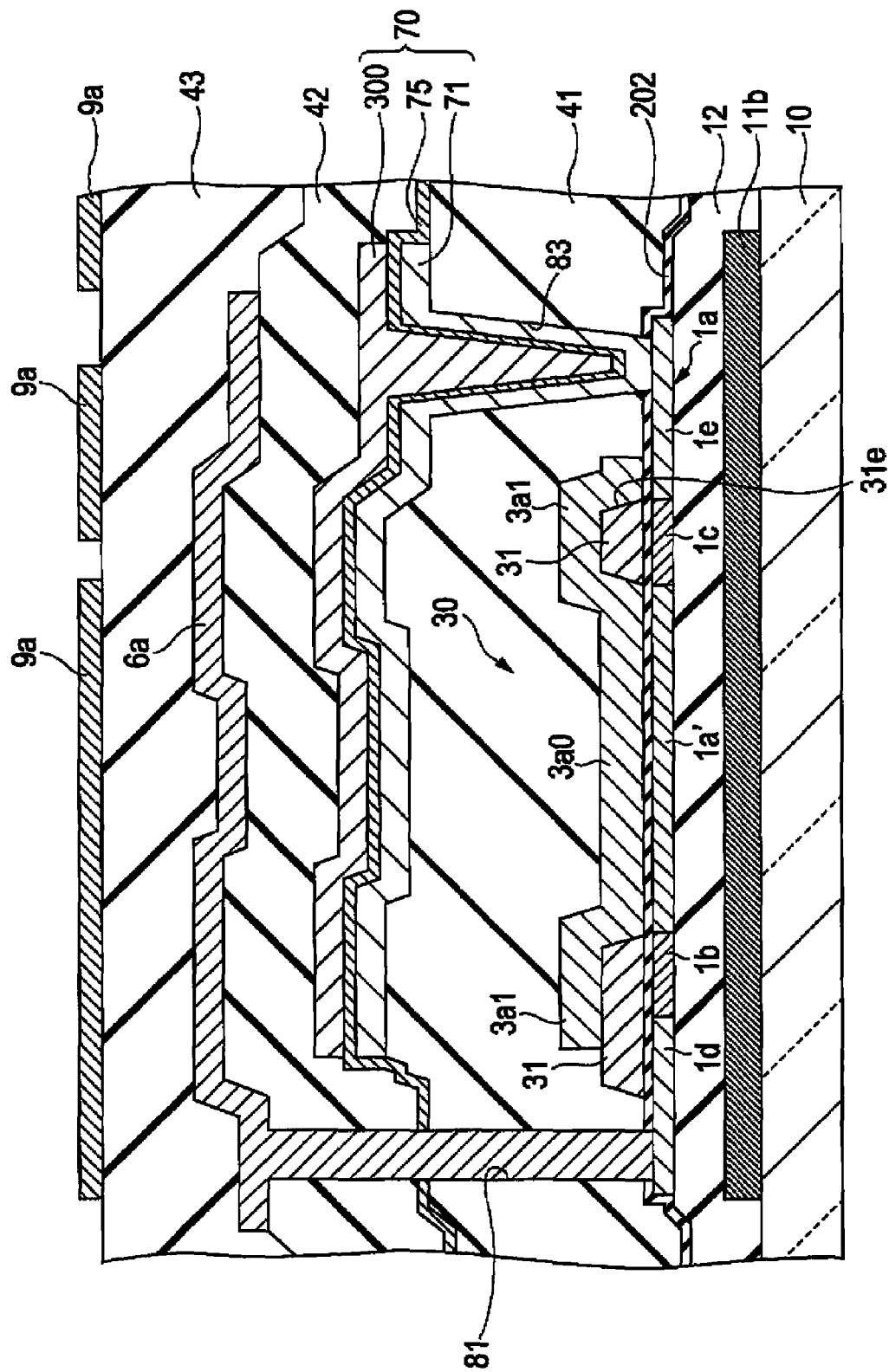
FIG. 10 is a cross-sectional view that is taken along the line X-X in FIG. 9.

As shown in FIG. 9 and FIG. 10 as an alternative example, the first extended portion 3a1 of the gate electrode 3a may also be formed at the side face portion 31e of the first insulating film 31 adjacent to the pixel electrode side source/drain region 1e. FIG. 9 is a plan view, similar to FIG. 5, according to the alternative example. FIG. 10 is a cross-sectional view that is taken along the line X-X in FIG. 9. Note that in FIG. 10, similar to FIG. 6 that shows the first embodiment, the storage capacitor 70, the data line 6a, the pixel electrode 9a, and the like, are shown together with the TFT 30.

As shown in FIG. 9, the first insulating film 31, as well as the configuration shown in FIG. 5, is provided so as to extend from at least the pixel electrode side LDD region 1c, out of the data line side LDD region 1b and the pixel electrode side LDD region 1c, but not to overlap at least portion of the corresponding pixel electrode side source/drain region 1e in plan view. In addition, the first insulating film 31 is provided so as to extend from the data line side LDD region 1b but not to overlap at least portion of the data line side source/drain region 1d corresponding to the data line side LDD region 1b.

The first extended portion 3a1 of the gate electrode 3a is formed at portions extending from a portion over the channel region 1a' through at least the pixel electrode side LDD region 1c, out of the data line side LDD region 1b and the pixel electrode side LDD region 1c, to a portion that overlaps at least portion of the pixel electrode side source/drain region 1e corresponding to the pixel electrode side LDD region 1c. Thus, the surface of the first insulating film 31 is covered with the first extended portion 3a1, ranging from the upper face portion directly above at least the pixel electrode side LDD region 1c of the semiconductor layer 1a to the side face portions on both sides of the upper face portion above the semiconductor layer 1a.

Here, in the present alternative example, the first extended portion 3a1, which is arranged at a position away from at least the pixel electrode side LDD region 1c of the semiconductor layer 1a via the first insulating film 31, is arranged adjacent to at least the pixel electrode side source/drain region 1e to about the thickness of the gate insulating film, which is a portion of the insulating film 202, for example.

The data line side source/drain region 1d and the pixel electrode side source/drain region 1e are densely doped conductive layers. For this reason, even when the first extended portion 3a1 of the gate electrode 3a is arranged adjacent to the data line side source/drain region 1d or to the pixel electrode side source/drain region 1e as described above, an electric field generated at the gate electrode 3a substantially or completely does not electrically influence the data line side source/drain region 1d and the pixel electrode side source/drain region 1e to cause a malfunction in the TFT 30 in terms of practical use.

Note that if arranging the first extended portion 3a1 so as to overlap the data line side source/drain region 1d or the pixel electrode side source/drain region 1e increases a parasitic capacitance in the TFT 30 and therefore causes malfunction in display on a pixel, it is only necessary to adjust the capacitance of the storage capacitor 70. For example, it is only necessary to increase the capacitance of the storage capacitor 70 in accordance with a parasitic capacitance generated in the TFT 30.

As shown in FIG. 9 and FIG. 10, according to the present alternative example, it is possible for the first extended portion 3a1 to at least cover the side faces of the pixel electrode side LDD region 1c of the semiconductor layer 1a from both sides and from at least the corresponding pixel electrode side source/drain region 1e side. That is, according to the present alternative example, the first extended portion 3a1 is also formed at the side face portion 31e of the first insulating film 31 adjacent to the pixel electrode side source/drain region 1e in addition to the upper face portion of the first insulating film 31 and the side face portions thereof on both sides of the pixel electrode side LDD region 1c. Thus, it is possible for the first extended portion 3a1 to block light that travels in the directions indicated by arrows Py in FIG. 9, for example, and that would obliquely enter the pixel electrode side LDD region 1c from the pixel electrode side source/drain region 1e side. Thus, by enhancing light shielding property for the pixel electrode side LDD region 1c of the semiconductor layer 1a, it is possible to further effectively reduce or prevent the occurrence of display defects, such as flicker, due to the occurrence of light leakage current.

Here, the reason why light leakage current tends to occur in the pixel electrode side LDD region 1c while the TFT 30 is operating as described above, in comparison with the data line side LDD region 1b, will be described in detail with reference to FIG. 11 to FIG. 16.

First, the measured results that were obtained by measuring the magnitude of drain current when light is irradiated to a testing TFT will be described with reference to FIG. 11. Here, FIG. 11 is a graph that shows a relationship, in a testing TFT, between a light irradiated portion and a drain current.

Figure 11:
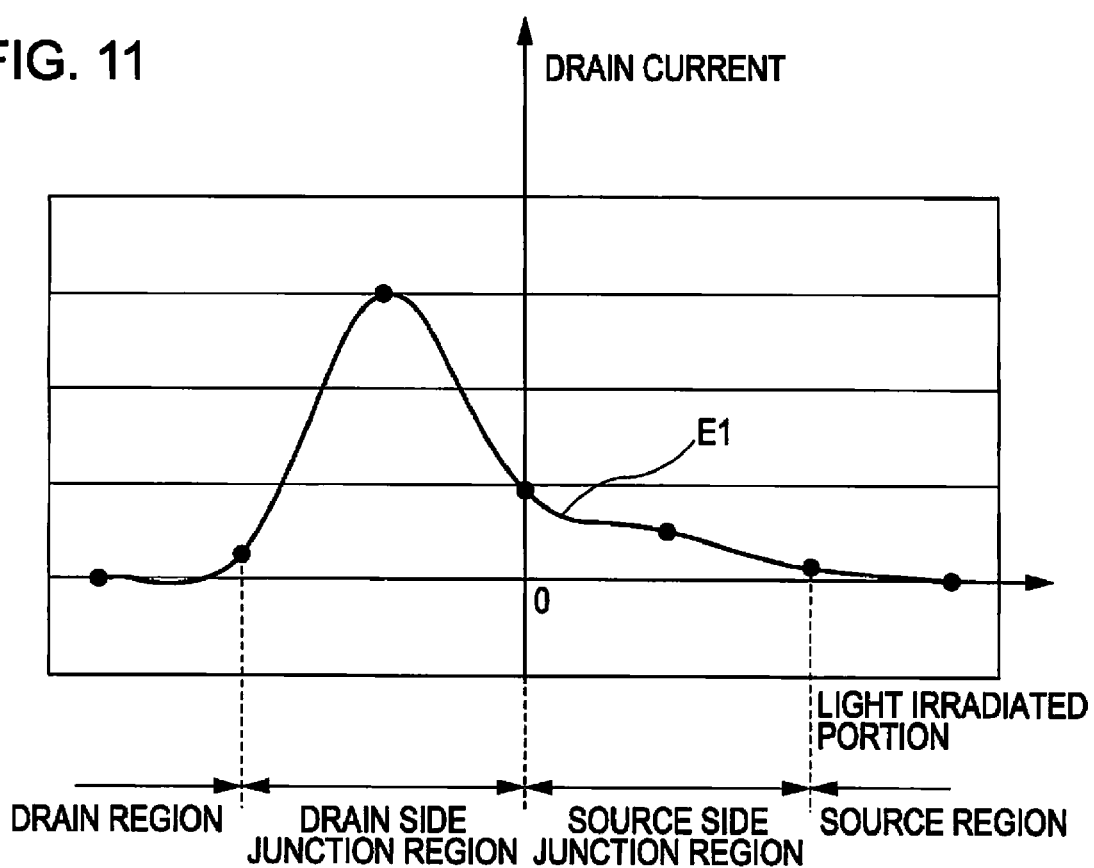
FIG. 11 is a graph that shows a relationship, in a testing TFT, between a light irradiated portion and a drain current.

In FIG. 11, data E1 are results obtained by measuring the magnitude of drain current when a light spot (visible light laser of approximately 2.4 um) is irradiated to a testing single TFT, that is, TEG (Test Element Group), while being scanned sequentially from the drain region side to the source region side. The TEG has, in addition to the channel region, the source region and the drain region, a source side junction region formed at a junction between the channel region and the source region and a drain side junction region formed at a junction between the channel region and the drain region.

Note that the abscissa axis of FIG. 11 represents light irradiated portion to which a light spot is irradiated, and the boundary between the channel region and the drain side junction region, the boundary between th channel region and the source side junction region, and further the channel region are defined as zero. The ordinate axis of FIG. 11 represents the magnitude of drain current (however, a relative value that is normalized using a predetermined value). The ordinate axis indicates a positive value (that is, a plus value) when the drain current flows from the drain region to the source region. The ordinate axis indicates a negative value (that is, a minus value) when the drain current flows from the source region to the drain region.

In FIG. 11, the data E1 indicate a plus value at any light irradiated portions. That is, the data E1 indicate that the drain current flows from the drain region to the source region. In addition, the data E1 indicate a larger value in the drain side junction region than in the source side junction region. That is, the data E1 indicate that the drain current is larger when a light spot is irradiated to the drain side junction region than when a light spot is irradiated to the source side junction region. In other words, light leakage current becomes larger when a light spot is irradiated to the drain side junction region than when a light spot is irradiated to the source side junction region. Note that the drain current is composed of dark current (or a subthreshold leakage, that is, leakage current that flows, in an off state of TEG, between the source region and the drain region even in a state where light is not irradiated) and light leakage current (or photoexcited current, that is, current that is generated because of excited electron by irradiating light).

Figure 12:
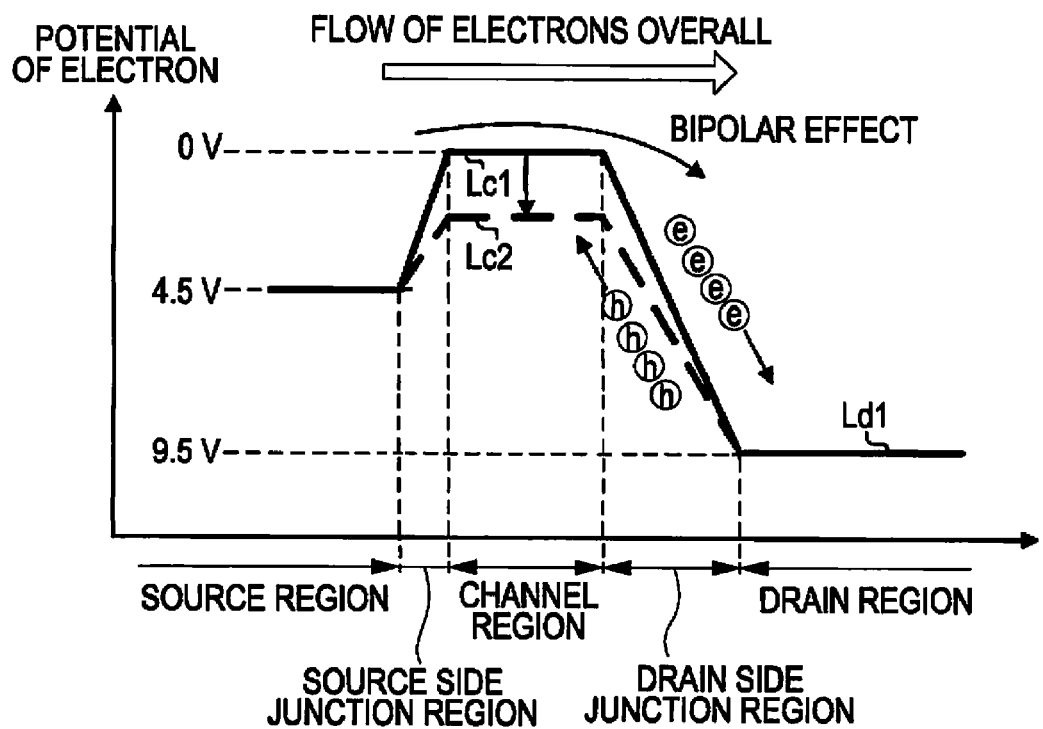
FIG. 12 is a conceptual diagram that shows the behavior of a carrier when photoexcitation occurs in a drain side junction region.
Figure 13:
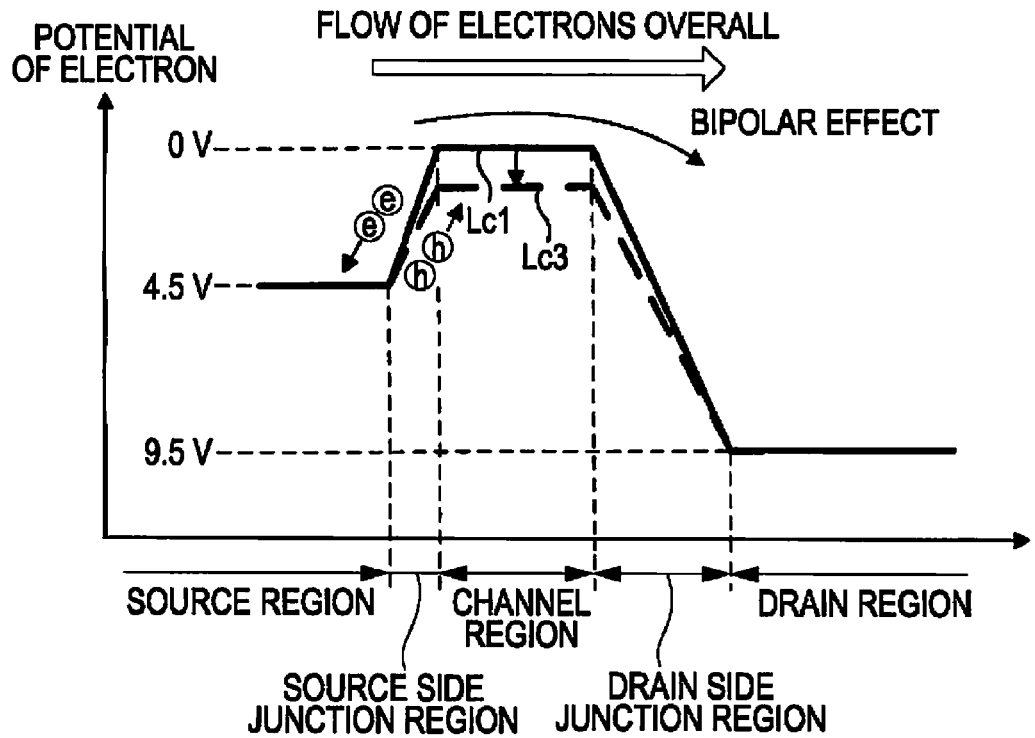
FIG. 13 is a conceptual diagram that shows the behavior of a carrier when photoexcitation occurs in a source side junction region.

Next, mechanism in which light leakage current becomes larger when a light spot is irradiated to the drain side junction region than when a light spot is irradiated to the source side junction region will be described with reference to FIG. 12 and FIG. 13. Here, FIG. 12 is a conceptual diagram that shows the behavior of a carrier when photoexcitation occurs in the drain side junction region. FIG. 13 is a conceptual diagram that shows the behavior of a carrier when photoexcitation occurs in the source side junction region. Note that, in FIG. 12 and FIG. 13, by assuming display of a middle gray scale in the pixel electrode 9a that is electrically connected to the above described TFT 30, the source electric potential (that is, the electric potential of the source region) is 4.5 V, the gate electric potential (that is, the electric potential of the channel region) is 0 V, and the drain electric potential (that is, the electric potential of the drain region) is 9.5 V. The abscissa axes of FIG. 12 and FIG. 13 each represent regions in the semiconductor layer that constitutes the TEG. The ordinate axes of FIG. 12 and FIG. 13 each represent a potential of electron (Fermi level). Electron has a negative electric charge, so that the potential of electron becomes lower the higher the electric potential is in the region, and the potential of electron becomes higher the lower the electric potential is in the region.

FIG. 12 shows the behavior of a carrier when a light spot is irradiated to the drain side junction region formed between the channel region and the drain region and then photoexcitation occurs in the drain side junction region.

In FIG. 12, light leakage current may be estimated to be composed of two current components.

That is, as a first current component, the light leakage current has a current component because of movement of electrons generated by photoexcitation. More specifically, the first current component is a current component that is generated when electrons (see "ee" in the drawing) generated by photoexcitation in the drain side junction region move from the drain side junction region to the drain region having a lower potential (this current component flows from the drain region to the source region).

As a second current component, the light leakage current has a current component because of movement of holes (that is, positive holes, denoted by "h" in the drawing) generated by photoexcitation. More specifically, the second current component is a current component because of the bipolar effect that is generated when holes generated by photoexcitation in the drain side junction region move from the drain side junction region to the channel region having a lower potential (that is, higher potential as to electrons). That is, the current component (this current component flows from the drain region to the source region) is due to the effect such that electrons that move from the source region to the drain region increase because the potential of the channel region (that is, a base potential) is reduced from a potential Lc1 to a potential Lc2 because of positive electric charges of holes that have moved to the channel region. Thus, when photoexcitation occurs in the drain side junction region, both the first current component and the second current component are generated in a direction (that is, in a direction from the drain region to the source region) to increase the drain current (in other words, collector current).

FIG. 13 shows the behavior of a carrier when a light spot is irradiated to the source side junction region formed between the channel region and the source region and then photoexcitation occurs in the source side junction region.

In FIG. 13, light leakage current may be estimated to be dominantly composed of the second current component due to the bipolar effect by which holes move from the source side junction region to the channel region having a lower potential (that is, higher potential as to electrons), which is different from the case where photoexcitation occurs in the drain side junction region as described with reference to FIG. 12. That is, it may be estimated that the first current component (this current component flows from the source region to the drain region) that is generated when electrons (see "e" in the drawing) generated by photoexcitation in the source side junction region move from the source side junction region to the source region having a lower potential is smaller than the second current component (this current component flows from the drain region to the source region) due to the bipolar effect.

In FIG. 13, the second current component due to the bipolar effect (that is, the current component due to the effect such that electrons that advances from the source region to the drain region because the base potential is reduced from a potential Lc1 to a potential Lc3 by positive electric charge of holes that have moved to the channel region) flows from the drain region to the source region. On the other hand, the above described first current component flows from the source region to the drain region. That is, the first current component and the second current component flow in the opposite directions. Here, referring back to FIG. 11, the drain current (see data E1) indicates a positive value when a light spot is irradiated from the source side junction region. That is, in this case, the drain current flows from the drain region to the source region. Thus, the first current component just suppresses the current component due to the bipolar effect, which is dark current or the second current component, and is not so large as to cause the drain current to flow from the source region to the drain region.

Moreover, because a difference in electric potential between the channel region and the source region is smaller than a difference in electric potential between the channel region and the drain region, a depleted region on the source region side (that is, the source side junction region) is narrower than a depleted region on the drain region side (that is, the drain side junction region). For this reason, when a light spot is irradiated to the source side junction region, the absolute magnitude of photoexcitation is small as compared with the case when a light spot is irradiated to the drain side junction region.

As described with reference to FIG. 12 and FIG. 13, when photoexcitation occurs in the drain side junction region, the first current component and the second current component both are generated to increase the drain current. On the other hand, when photoexcitation occurs in the source side junction region, the first current component suppresses the second current component. Thus, the drain current becomes larger (that is, light leakage current becomes large) when a light spot is irradiated to the drain side junction region than when a light spot is irradiated to the source side junction region.

Figure 14:
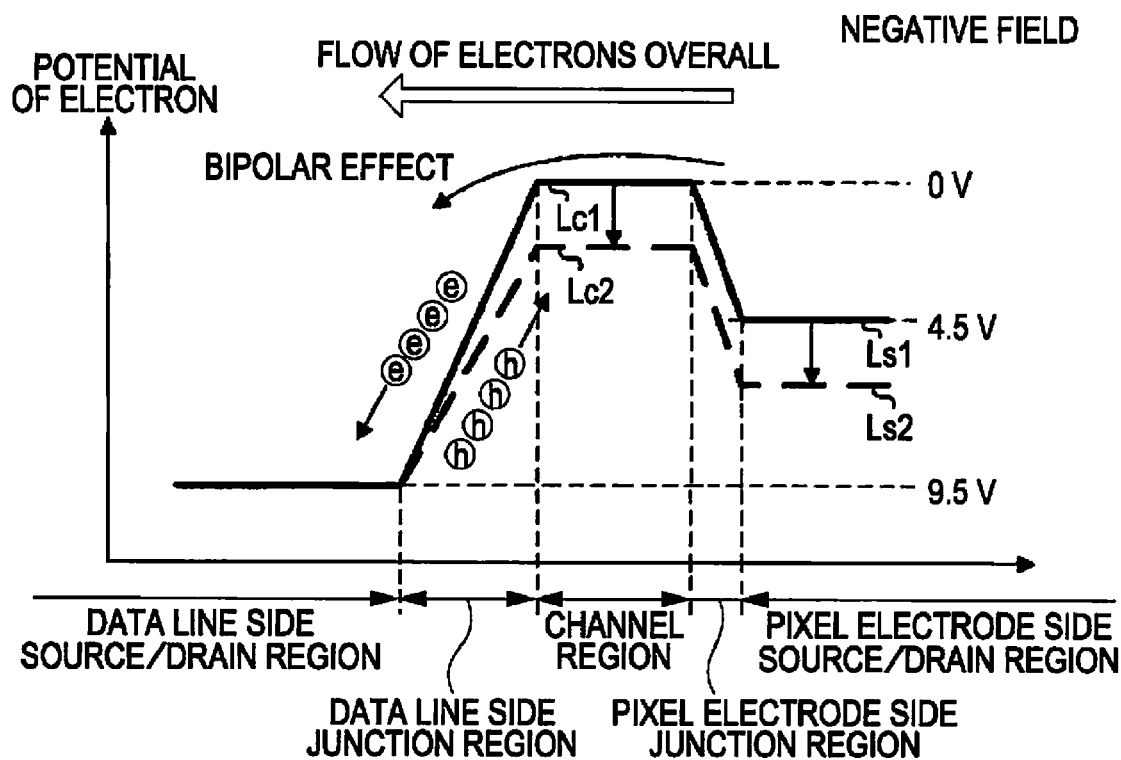
FIG. 14 is a conceptual diagram that shows the behavior of a carrier when photoexcitation occurs in a data line side junction region (in other words, a drain side junction region) in the case where a data line side source/drain region is applied with a drain electric potential.
Figure 15:
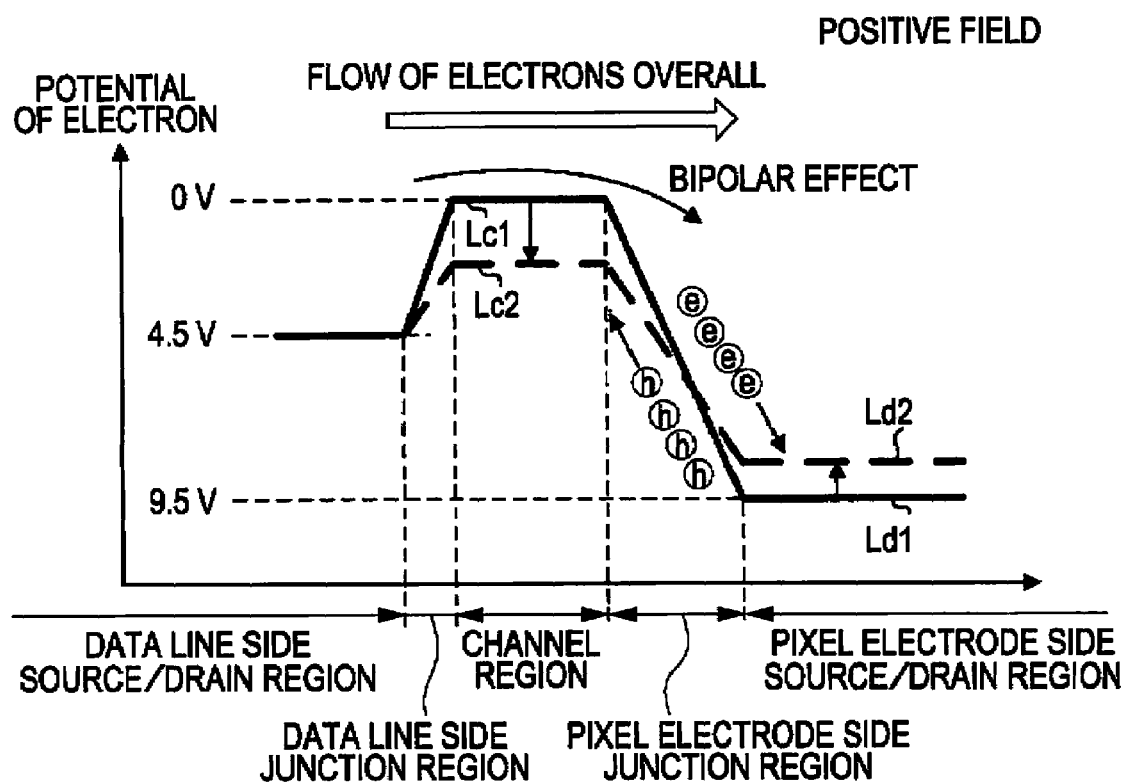
FIG. 15 is a conceptual diagram that shows the behavior of a carrier when photoexcitation occurs in a pixel electrode side junction region (in other words, a drain side junction region) in the case where the pixel electrode side source/drain region is applied with a drain electric potential.

Next, mechanism in which light leakage current increases when the pixel electrode side source/drain region is applied with a drain electric potential and a light spot is irradiated to the pixel electrode side junction region than when the data line side source/drain region is applied with a drain electric potential and a light spot is irradiated to the data line side junction region will be described with reference to FIG. 14 and FIG. 15. Here, FIG. 14 is a conceptual diagram that shows the behavior of a carrier when photoexcitation occurs in the data line side junction region (that is, the drain side junction region) in the case where the data line side source/drain region is applied with a drain electric potential. FIG. 15 is a conceptual diagram that shows the behavior of a carrier when photoexcitation occurs in the pixel electrode side junction region (in other words, the drain side junction region) in the case where the pixel electrode side source/drain region is applied with a drain electric potential.

Hereinafter, the case where electric charge is held at a pixel portion that includes a pixel switching TFT and photoexcitation has occurred will be considered. This differs from the case where the above described TEG is assumed in that the pixel electrode side of the pixel switching TFT may be made into a floating state. A holding capacitor, such as the storage capacitor 70, may be connected to the pixel electrode side of the pixel switching TFT. When the capacitance of the holding capacitor is sufficiently large, the pixel electrode side is made into a state similar to a fixed electrode as in the case that uses the above described TEG. However, when the capacitance of the holding capacitor is not sufficiently large, the pixel electrode side is made into a floating state or a state closer to the floating state. Note that, here, it is assumed that the above capacitance is not sufficiently large.

In FIG. 14 and FIG. 15, alternating current drive is employed in the liquid crystal device in order to prevent a so-called burn-in. Here, by assuming display of a middle gray scale, it is assumed when the pixel electrode is alternately held with an electric charge of 4.5 V negative field and an electric charge of 9.5 V positive field using 7 V as a reference electric potential. Therefore, the source and drain of the pixel switching TFT are not fixed but exchanged between the pixel electrode side source/drain region and the data line side source/drain region. That is, as shown in FIG. 14, when the electric charge of negative field is held by the pixel electrode (that is, when the electric potential of the pixel electrode side source/drain region is lower than the electric potential of the data line side source/drain region), the pixel electrode side source/drain region becomes a source. In contrast, as shown in FIG. 15, when the electric charge of positive field is held by the pixel electrode (that is, when the electric potential of the pixel electrode side source/drain region is higher than the electric potential of the data line side source/drain region), the pixel electrode side source/drain region becomes a drain.

In FIG. 14, when the electric charge of negative field is held by the pixel electrode, the pixel electrode side source/drain region becomes a source (or an emitter), and the data line side source/drain region becomes a drain (or a collector). When photoexcitation occurs in the data line side junction region, which is the drain side junction region, as described above, the first current component based on movement of electrons generated by the photoexcitation and the second current component due to the bipolar effect are generated. Here, when the second current component is generated on the basis of the bipolar effect (that is, the base potential is reduced from the potential Lc1 to the potential Lc2, and electrons move from the pixel electrode side source/drain region, which serves as a source, to the data line side source/drain region, which serves as a drain), electrons are taken out from the pixel electrode side source/drain region, which is in a floating state. Thus, the potential of the pixel electrode side source/drain region, which serves as an emitter, is reduced from the potential Ls1 to the potential Ls2 (the electric potential increases). That is, when photoexcitation occurs in the data line side junction region, which is the drain side junction region, the base potential decreases and the potential of the pixel electrode side source/drain region, which serves as an emitter, decreases. In other words, when photoexcitation occurs in the data line side junction region, which is the drain side junction region, the emitter electric potential increases as the base electric potential increases. For this reason, the drain current (that is, collector current) is suppressed.

On the other hand, in FIG. 15, when the electric charge of positive field is held by the pixel electrode, the data line side source/drain region becomes a source (or an emitter), and the pixel electrode side source/drain region becomes a drain (or a collector). When photoexcitation occurs in the pixel electrode side junction region, which is the drain side junction region, as described above, the first current component based on movement of electrons generated by the photoexcitation and the second current component due to the bipolar effect are generated. Here, because the data line side source/drain region, which serves as a source, is connected to the data line, the data line side source/drain region is not made into a floating state, unlike the pixel electrode, and the electric potential thereof does not change. Here, when the second current component is generated on the basis of the bipolar effect (that is, the base potential is reduced from the potential Lc1 to the potential Lc2, and electrons move from the data line side source/drain region, which serves as a source, to the pixel electrode side source/drain region, which serves as a drain), electrons flow to the pixel electrode side source/drain region, which is in a floating state. Thus, the potential of the pixel electrode side source/drain region, which serves as a collector, is increased from the potential Ld1 to the potential Ld2 (the electric potential decreases). However, the increase in potential of the pixel electrode side source/drain region, which serves as a collector, unlike the decrease in potential of the pixel electrode side source/drain region, which serves as a source as described above, hardly functions to suppress the drain current. The drain current (that is, collector current) is determined mainly on the basis of the magnitude of base electric potential relative to the emitter electric potential, so that a decrease in collector electric potential hardly suppresses the drain current, that is, the bipolar transistor enters a saturation region.

As described with reference to FIG. 14 and FIG. 15, when the electric charge of positive field is held by the pixel electrode (that is, when the pixel electrode side source/drain region becomes a drain), the second current component due to the bipolar effect is hardly suppressed; in contrast, when the electric charge of negative field is held by the pixel electrode (that is, when the data line side source/drain region becomes a drain), the second current component due to the bipolar effect is suppressed because of the increase in electric potential of the pixel electrode side source/drain region, which is in a floating state. That is, the drain current increases on the basis of light leakage current when the pixel electrode side source/drain region becomes a drain than when the data line side source/drain region becomes a drain.

Figure 16:
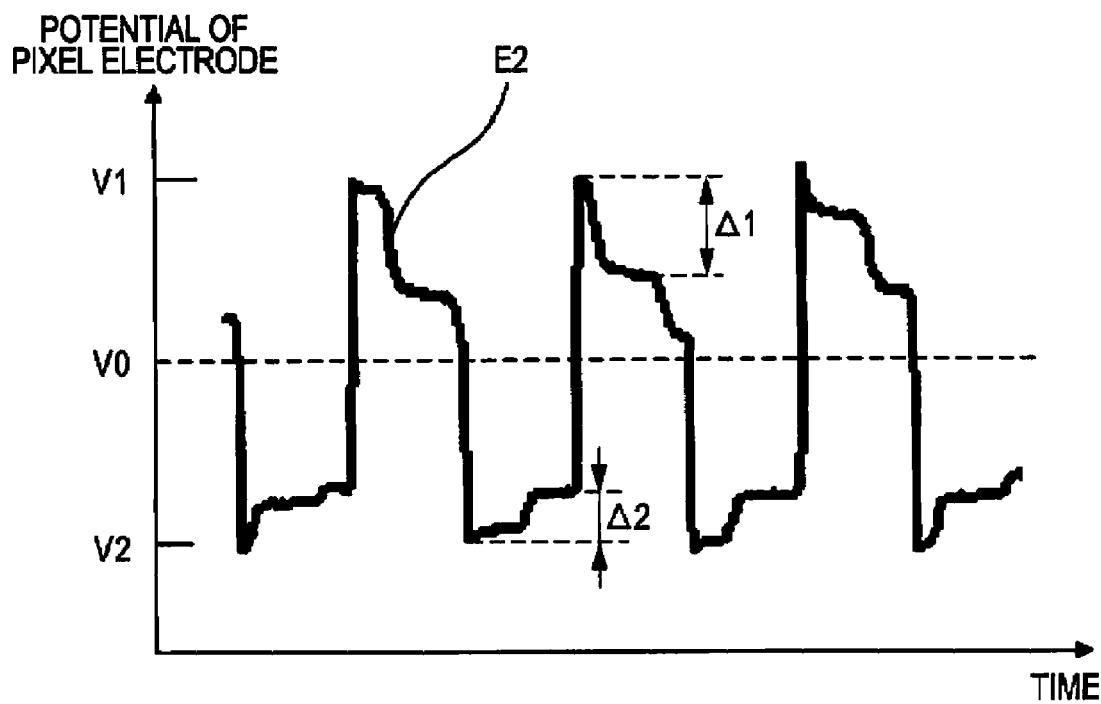
FIG. 16 is a view that shows a waveform of a pixel electrode electric potential when relatively intensive light is irradiated to the overall pixel switching TFT.

Here, FIG. 16 is a view that shows a waveform of a pixel electrode electric potential when relatively intensive light is irradiated to the overall pixel switching TFT.

In FIG. 16, data E2 indicate that the variation Δ1 in pixel electrode electric potential when the electric charge of positive field is held by the pixel electrode (when the pixel electrode electric potential is an electric potential V1) is larger than the variation Δ2 in pixel electrode electric potential when the electric charge of negative field is held by the pixel electrode (when the pixel electrode electric potential is an electric potential V2). That is, the data E2 indicate that the electric charge of positive field is held poorer in the pixel electrode than the electric charge of negative field (that is, light leakage is likely to occur). This coincides with the above described mechanism in which light leakage current tends to occur when the electric charge of positive field is held by the pixel electrode (that is, when the pixel electrode side source/drain region becomes a drain) than when the electric charge of negative field is held by the pixel electrode (that is, when the data line side source/drain region becomes a drain).

As described above in detail with reference to FIG. 11 to FIG. 16, the drain current is likely to increase when photoexcitation occurs in the drain side junction region of the pixel switching TFT. Furthermore, the drain current is likely to increase when the pixel electrode side source/drain region becomes a drain (conversely, when the data line side source/drain region becomes a drain, the current component due to the bipolar effect is suppressed). Thus, as in the case of the liquid crystal device according to the present embodiment, by enhancing a light shielding property for the pixel electrode side LDD region 1c, which is the pixel electrode side junction region, higher than a light shielding property for the data line side LDD region 1b, which is the data line side junction region, it is possible to highly effectively reduce light leakage current in the TFT 30 while maintaining a high aperture ratio.

Figure 17:
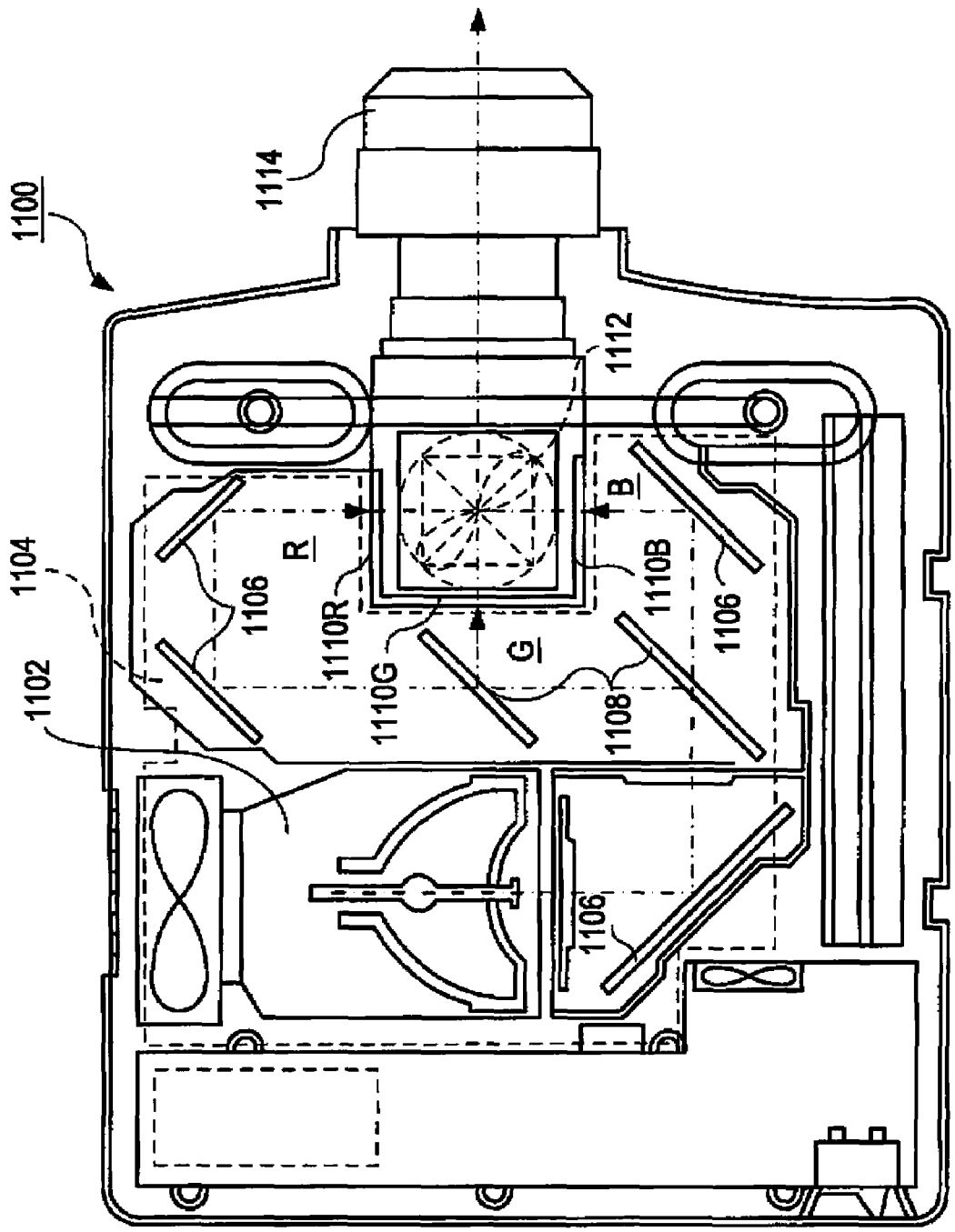
FIG. 17 is a plan view that shows the configuration of a projector, which is one example of an electronic apparatus to which the electro-optical device is applied.

Next, the case where the liquid crystal device, which is the above described electro-optical device, is applied to various electronic apparatuses will be described. Here, FIG. 17 is a plan view that shows a configuration example of a projector. Hereinafter, a projector that uses the liquid crystal device as a light valve will be described.

As shown in FIG. 17, a projector 1100 installs therein a lamp unit 1102 formed of a white light source, such as a halogen lamp. Light projected from the lamp unit 1102 is split into three primary colors, that is, RGB, by four mirrors 1106 and two dichroic mirrors 1108, which are arranged in a light guide 1104 and then enter liquid crystal panels 1110R, 1110B and 1110G, which are light valves corresponding to the primary colors.

The configurations of the liquid crystal panels 1110R, 1110B and 1110G are equivalent to the above described liquid crystal device, and are respectively driven by primary color signals of R, G, B, which are supplied from an image signal processing circuit. Then, light modulated by these liquid crystal panels enters a dichroic prism 1112 from the three directions. In this dichroic prism 1112, R light and B light are refracted at a right angle while, on the other hand, G light goes straight. Thus, by composing images corresponding to the respective colors, a color image is projected onto a screen, or the like, through a projection lens 1114.

Here, focusing on display images by the liquid crystal panels 1110R, 1110B and 1110G, the display image by the liquid crystal panel 1110G needs to be mirror reversed relative to the display images of the liquid crystal panels 1110R, 1110B.

Note that, because rays of light corresponding to the primary colors of R, G, B enter the liquid crystal panels 1110R, 1110B and 1110G by the dichroic mirrors 1108, no color filter needs to be provided.

Note that, in addition to the electronic apparatus described with reference to FIG. 17, the electronic apparatus may include a mobile personal computer, a cellular phone, a liquid crystal television, a viewfinder-type or a direct-view-type video tape recorder, a car navigation system, a pager, a personal organizer, an electronic calculator, a word processor, a workstation, a video telephone, a point-of-sales terminal, and devices provided with a touch panel. Then, of course, the aspects of the invention may be applied to the above various electronic apparatuses.

In addition, the aspects of the invention may be applied to a reflective liquid crystal device (LCOS), a plasma display (PDP), a field emission display (FED, SED), an organic EL display, a digital micromirror device (DMD), an electrophoretic device, or the like, in addition to the liquid crystal device described in the above embodiments.

The invention is not limited to the above described embodiments, and may be modified into various forms without departing from the spirit and scope of the invention as described in the appended claims and specification. The scope of the invention also encompasses the thus modified electro-optical device, and an electronic apparatus provided with the electro-optical device.

The entire disclosure of Japanese Patent Application No. 2007-294308, filed Nov. 13, 2007 is expressly incorporated by reference herein.

What is claimed is:

1. An electro-optical device comprising:
   a substrate;
   a data line and a scanning line that intersect with each other over the substrate;
   a pixel electrode that is provided at a position corresponding to an intersection of the data line and the scanning line;
   a semiconductor layer that includes:
      a channel region that has a channel length in an extending direction in which one of the data line and the scanning line extends;
      a data line side source/drain region that is electrically connected to the data line;
      a pixel electrode side source/drain region that is electrically connected to the pixel electrode;
      a first junction region located between the channel region and the data line side source/drain region; and
      a second junction region located between the channel region and the pixel electrode side source/drain region;
   a first insulating film having an island shape that covers the second junction region and that does not overlap the channel region in plan view;
   a gate electrode that includes:
      a body portion that overlaps the channel region via a gate insulating film;
      a first extended portion that extends from the body portion onto the first insulating film; and
      a second extended portion that extends from the first extended portion in a direction that intersects the extending direction to beside the semiconductor layer; and
   a second insulating film between the substrate and the semiconductor layer, the second insulating film having a groove that extends along at least the second junction region of the semiconductor layer beside the first insulating film as viewed in plan, wherein
   the first extended portion continuously covers a portion of the first insulating film that includes an upper face portion located directly above the second junction region and a side face portion located beside the second junction region, and
   the second extended portion overlaps the groove and has an inner groove portion that is formed inside the groove.

2. The electro-optical device according to claim 1, wherein the second extended portion is arranged on each side of the semiconductor layer with the semiconductor layer placed in between.

3. The electro-optical device according to claim 1, wherein the scanning line and at least the second extended portion of the gate electrode are formed integrally with the same film.

4. The electro-optical device according to claim 1, further comprising:
   a lower light shielding film that is arranged on a lower layer side with respect to the second insulating film on the substrate, that at least partially overlaps the semiconductor layer and that contains a light shielding material, wherein
   the groove is formed to extend through the second insulating film to a surface of the lower light shielding film, and wherein
   the inner groove portion is formed in the groove so as to be electrically connected to the lower light shielding film.

5. The electro-optical device according to claim 1, wherein as viewed in plan on the substrate,
   the first insulating film is provided so as not to overlap at least portion of one of the data line side source/drain region or the pixel electrode side source/drain region, wherein
   the first extended portion is extended so as to overlap at least portion of one of the data line side source/drain region or the pixel electrode side source/drain region.

6. The electro-optical device according to claim 1, wherein the first insulating film is formed to have a thickness that is larger than the gate insulating film.

7. The electro-optical device according to claim 1, wherein the second junction region, as viewed in plan on the substrate, is at least partially arranged in a crossover region at which the data line intersects with the scanning line.

8. The electro-optical device according to claim 1, wherein the second junction region is an LDD region.

9. An electronic apparatus comprising the electro-optical device according to claim 1.

* * * * *